(12) United States Patent
Savas et al.

(10) Patent No.: US 9,831,466 B2
(45) Date of Patent: Nov. 28, 2017

(54) METHOD FOR DEPOSITING A MULTI-LAYER MOISTURE BARRIER ON ELECTRONIC DEVICES AND ELECTRONIC DEVICES PROTECTED BY A MULTI-LAYER MOISTURE BARRIER

(71) Applicant: AIXTRON SE, Herzogenrath (DE)

(72) Inventors: Stephen E. Savas, Fremont, CA (US); Allan B. Wiesnoski, Fremont, CA (US); Carl Galewski, Fremont, CA (US)

(73) Assignee: AIXTRON SE, Herzogenrath (DE)

( * ) Notice: Subject to any disclaimer, the term of this patent is extended or adjusted under 35 U.S.C. 154(b) by 0 days.

(21) Appl. No.: 14/892,189

(22) PCT Filed: Jun. 30, 2014

(86) PCT No.: PCT/US2014/044954
§ 371 (c)(1),
(2) Date: Nov. 18, 2015

(87) PCT Pub. No.: WO2014/210613
PCT Pub. Date: Dec. 31, 2014

(65) Prior Publication Data
US 2016/0111684 A1    Apr. 21, 2016

Related U.S. Application Data

(60) Provisional application No. 61/841,287, filed on Jun. 29, 2013, provisional application No. 61/976,420, filed on Apr. 7, 2014.

(51) Int. Cl.
*H01L 51/52*    (2006.01)
*H01L 51/00*    (2006.01)
(Continued)

(52) U.S. Cl.
CPC ........ *H01L 51/5256* (2013.01); *C23C 16/308* (2013.01); *C23C 16/345* (2013.01);
(Continued)

(58) Field of Classification Search
CPC ............. H01L 51/5256; H01L 51/0097; H01L 51/5243; H01L 51/56; H01L 2251/301; H01L 2251/5338; H01L 2251/558
See application file for complete search history.

(56) References Cited

U.S. PATENT DOCUMENTS 5,180,435 A    1/1993    Markunas et al.
5,935,334 A    8/1999    Fong et al.
(Continued)

FOREIGN PATENT DOCUMENTS

JP    2001-274156 A    10/2001
JP    2004-281402 A    10/2004
(Continued)

OTHER PUBLICATIONS

International Search Report, from the Korean Intellectual Property Office dated Oct. 21, 2014, for PCT/US2014/044954 (filed Jun. 30, 2014), 3 pgs.
(Continued)

*Primary Examiner* — Peter Bradford
(74) *Attorney, Agent, or Firm* — Ascenda Law Group, PC

(57) ABSTRACT

A method is disclosed for forming multi-layered structures on polymeric or other materials that provide optical functions or protect underlying layers from exposure to oxygen and water vapor. Novel devices are also disclosed that may include both multi-layered protective structures and AMOLED display, OLED lighting or photovoltaic devices. The protective multi-layer structure itself may be made by depositing successively on a substrate at least three very thin layers of material with different density or composition. In
(Continued)

some methods for deposition of such film, the layers are deposited by varying the energy of ion bombardment per unit thickness of the film. Any layer of the structure may include one or more of the materials: silicon nitride, silicon oxide, silicon oxynitride, or metallic nitride or oxide. Specific commercial applications that benefit from this include manufacturing of photovoltaic devices or organic light emitting diode devices (OLED) including lighting and displays.

29 Claims, 21 Drawing Sheets

(51) Int. Cl.
*H01L 51/56* (2006.01)
*C23C 16/30* (2006.01)
*C23C 16/34* (2006.01)
*C23C 16/50* (2006.01)

(52) U.S. Cl.
CPC .......... *C23C 16/50* (2013.01); *H01L 51/0097* (2013.01); *H01L 51/5243* (2013.01); *H01L 51/56* (2013.01); *H01L 2251/301* (2013.01); *H01L 2251/5338* (2013.01); *H01L 2251/558* (2013.01)

(56) References Cited

U.S. PATENT DOCUMENTS

| | | | |
|---|---|---|---|
| 6,578,369 B2* | 6/2003 | Kunkel | B05B 1/20 118/308 |
| 7,265,807 B2 | 9/2007 | Lifka et al. | |
| 7,710,032 B2 | 5/2010 | Lifka et al. | |
| 7,867,923 B2 | 1/2011 | Mallick et al. | |
| 9,299,956 B2 | 3/2016 | Savas et al. | |
| 2002/0180924 A1 | 12/2002 | Sobrinho | |
| 2007/0046183 A1 | 3/2007 | Kwok et al. | |
| 2009/0053491 A1 | 2/2009 | Loboda et al. | |
| 2011/0005681 A1 | 1/2011 | Savas et al. | |
| 2011/0005682 A1 | 1/2011 | Savas et al. | |
| 2011/0006040 A1 | 1/2011 | Savas et al. | |
| 2011/0122486 A1* | 5/2011 | Busch | C23C 16/26 359/359 |
| 2012/0225218 A1 | 9/2012 | Savas et al. | |
| 2012/0248422 A1* | 10/2012 | Mine | H01L 51/5256 257/40 |
| 2013/0187536 A1* | 7/2013 | Seo | C09K 11/06 313/504 |
| 2013/0334511 A1* | 12/2013 | Savas | H01L 51/56 257/40 |
| 2016/0087242 A1* | 3/2016 | Chen | H01L 51/5256 257/100 |

FOREIGN PATENT DOCUMENTS

| | | |
|---|---|---|
| JP | 2005-063850 A | 3/2005 |
| JP | 4784308 B2 | 10/2011 |

OTHER PUBLICATIONS

International Preliminary Report on Patentability dated Sep. 16, 2015, for International Patent Application No. PCT/US2014/044954 (filed Jun. 30, 2014), 10 pages.
Written Opinion of the International Searching Authority dated Oct. 21, 2014, from Korean Intellectual Property Office, for International Patent Application No. PCT/US2014/044954 (filed Jun. 30, 2014), 9 pages.
Request for Entry, Entry into the European phase filed Jan. 11, 2016, for EP Application No. EP14816799.2, 12 pages.
Supplementary European Search Report dated Feb. 6, 2017, for EP Application No. EP14816799.2, 6 pages.
Kohno; et al., "High performance poly-Si TFTs fabricated using pulsed laser annealing and remote plasma CVD with low temperature processing", IEEE Transactions on Electron Devices (Feb. 1995), 42(2):251-257.

* cited by examiner

METHOD FOR DEPOSITING A MULTI-LAYER MOISTURE BARRIER ON ELECTRONIC DEVICES AND ELECTRONIC DEVICES PROTECTED BY A MULTI-LAYER MOISTURE BARRIER

RELATED APPLICATIONS

This application is a National Stage under 35 USC 371 of and claims priority to International Application No. PCT/US2014/044954, filed Jun. 30, 2014, which claims the priority benefit of US. Provisional Application No. 61/841,287, filed Jun. 29, 2013, and US. Provisional Application No. 61/976,420, filed Apr. 7, 2014; the contents of which are hereby incorporated by reference.

FIELD OF THE INVENTION

This invention pertains to a method for depositing high-performance coatings either as barriers to protect against penetration of oxygen and water vapor, or to provide anti-reflection or optical filtering.

BACKGROUND OF THE INVENTION

Thin films that protect an underlying material sensitive to moisture, oxygen and other chemicals are commonly used in many industrial processes. Applications range from food packaging, hard coatings on eyeglass lenses, and window glass, to protection of integrated circuits, display screens, and photovoltaic panels. Such thin films need to be dense, have excellent adhesion to the underlying layer and not crack or peel for the life of the product. In some cases the coating needs to be a hermetic seal, keeping out water vapor and oxygen, and in this case it must not have too many tiny pinhole leaks that would disrupt the function of even tiny areas of the underlying structure or device. Further, for many of the most high value applications such as OLED display screens, lighting panels, or organic photovoltaic panels, where the barrier needs to be tightest, the under-layers must not be exposed during manufacturing to temperatures above a limit that may range from slightly over hundred degrees Celsius in some cases to less than about seventy five degrees for some polymers. In some new products such as flexible circuits and screens, the device that needs to be protected will be built on a flexible substrate material and must be capable of being bent repeatedly without causing the protective function to be compromised.

Presently, adhesion of deposited coatings is achieved either by first putting down an intermediate layer of highly wettable polymer layers, or by subjecting the surface to an inert plasma. Where the application is very cost sensitive it may be too expensive to use such wettable polymers, and for many inexpensive plastics an inert gas treatment has been found not to be effective in promoting adequate adhesion of the hard coating. Therefore, a more effective and less expensive method of ensuring adequate adhesion of coatings is needed.

For deposition of dense hermetic barrier layers at such low temperatures, sputtering of target material onto the substrate is the most common method used. This technique works quite well at substrate temperatures less than or about 100° C., but this technique generates substantial heat and produces films that are often not as amorphous and effective as barriers. In some applications where the plastic or polymer substrate is thick or cannot be cooled effectively sputtering may not be acceptable due to heating of the substrate.

Plasma enhanced CVD has been used very predominantly in applications where the limiting temperature for the substrate is above about 250° C., but has not been capable of providing commercially competitive rates of deposition of high quality dielectrics at substrate temperatures under 100° C.

There are a few new and very demanding, high value applications for the hermetic encapsulation processes. Among these are encapsulation of organic and CIGS photovoltaic devices (PV), and encapsulation of organic light emitting diode (OLED) devices for both lighting and displays (Active Matrix OLED=AMOLED). These applications all have the strong requirement that the encapsulation be highly transparent to visible light, and very low in moisture and oxygen penetration. Solar panels using thin film materials such as CIGS or organic polymer for photovoltaic conversion require encapsulation with transmission rates from $10^{-4}$ to $10^{-5}$ gm/m$^2$-day of water vapor. For these applications cost must be very low as well so that end products are competitive. For applications such as OLED lighting and Organic PV modules the cost per square meter should be less than or about US$10/m$^2$ since the total cost of such panels or web needs to be less than US$60/m$^2$ and even as low as US$30/m$^2$. For CIGS encapsulation cost must be no greater than $15/m$^2$ to $20/m$^2$, and for OLED displays encapsulation cost may be as much as $100/m$^2$ since the display screen total cost of manufacture will be between about $1000/m$^2$ to $2000/m$^2$.

The most demanding application is for AMOLED displays. Compared to commonly used liquid crystal displays (LCD), AMOLED technology can provide many benefits, including lower power consumption, higher contrast, wider viewing angles and the ability to be made on flexible substrates. But there are also substantial technological challenges to be solved before AMOLED displays larger than a square decimeter—such as useful for tablet or laptop displays—can be manufactured with high yield.

In particular, the interface between low work-function metals, used for the electron emitting layer in an OLED device, and the electron transport layer are highly sensitive to damage by oxidation. Therefore, to achieve a useful lifetime in air, an OLED display must be encapsulated such that the oxygen transmission rate (OTR) is less than $10^{-3}$ to $10^{-5}$ scc/m$^2$-day and water vapor transmission rate (WVTR) is even less than $10^{-7}$ g/m$^2$-day with NO pinholes whatever! Currently this can only be done in mass production using a top covering of glass which is 100 or more microns thick. In comparison an LCD display is relatively insensitive to water or oxygen and requires encapsulation rated at OTR and WVTR of order 0.1 scc/m$^2$-day or g/m$^2$-day.

As a reference point to understand the needed tightness of such encapsulation, the air and moisture leakage requirement for an OLED display is equivalent to that of a high-vacuum chamber with a He leak rate on the order of $10^{-10}$ standard cc/sec. High-vacuum chambers with such a high degree of vacuum integrity are not uncommon, but require careful design, use metal seals, are expensive to make and are not generally mass-produced.

It has been demonstrated that OLED displays can be sufficiently encapsulated when built on glass substrates by installing a top glass layer with a perimeter seal to the OLED area. As this perimeter seal is based on polymers that allow for some permeation or leakage of oxygen and water, requiring a "gettering" material in the space surrounding the OLED to absorb oxygen and water. This is an expensive technique ($50/m$^2$ to $100/m$^2$) and only suitable for relatively small and rigid displays, such as on smart phones or tablets. This encapsulation technique also suffers from difficulty relating to stresses when front and back surfaces are not maintained at precisely the same temperature. Finally, the double glass encapsulation method is almost inflexible, even when the glass cover is extremely thin. This is extremely limiting since the highest value OLED displays will be those that are flexible, both because they will be lighter and less fragile, and able to made into new and compact displays that simply cannot be made with LCD technology. Thus, new encapsulation methods are needed for OLED to realize its full potential.

More recently, other types of "thin film" hermetic coatings made with plasma-based CVD methods have been tried. In particular they have been inorganic dielectrics such as silicon dioxide, silicon nitride, and other materials often made by Plasma enhanced or assisted deposition methods or atomic layer deposition (ALD) of such materials as aluminum oxide and titanium dioxide. Such films when they are thick enough to be robust and scratch resistant are quite brittle and do not tolerate flexure of the substrate very well. Further, thicker conventional PECVD or PACVD layers that are more robust have poor bonding around the edges of the surface defects and during flexure of the substrate initiate microcracks around such defects where material quality is poor. Such microcracks then propagate into the barrier layer resulting in leakage paths for moisture.

To reduce cost, increase manufacturing yield, and increase applications for OLED both in lighting and displays there is a need to find methods and tools that enable high-volume production encapsulation with transparent thin films between about 30 nm and about 10 μm thick that provide the equivalent integrity of a high-vacuum chamber. In the case of flexible displays, which would be useful for many commercial applications, hard, inorganic barriers usually need to be somewhat less than about 100 nm thick to avoid cracking when the screen is flexed or there is a temperature difference between front and back surfaces of tens of degrees Celsius. The consequent leaking of atmosphere into the sensitive material layers damages the device, making a "black spot" on the screen or lighting panel. Other barrier materials may be mixed organic-inorganic coatings that have both high transparency for visible light and barrier function while being up to 10 microns thick.

The prior art demonstrates that thin barrier films exist that have the ability to meet the requirements of OLED encapsulation under ideal conditions. Films including of inorganic nitrides, oxides, and oxynitrides are particularly suitable as they also are transparent. In particular aluminum oxide, silicon nitride and silicon oxynitride are commonly used. These are highly transparent and yet very dense dielectrics that do not permit substantial moisture permeation and can be applied by vacuum coating processes for which there is substantial production experience.

Some prior art overcomes the effect of localized particles or other defects in one barrier layer by using multiple such layers, often with a planarizing, soft and flexible organic inter-layers between inorganic barrier layers. In the case of the organic inter-layers the motivation is to bury the defects in the flexible polymer and deposit each new barrier layer on the clean polymer surface. This ideally results in a wide lateral separation of the defects in successive barrier layers such that the effective path length for transmission of oxygen and water molecules is substantially increased, and a very long latency period before moisture can penetrate all layers to the device. The prior art suggest that as many as 3 to 7 repeated stacks of interlayer and barrier films are required to achieve oxygen or water vapor transmission rates (OTR & WVTR respectively) adequate for extended lifetime (up to 10 years) of an OLED display.

Panels, modules, or sheets of organic PV or CIGS are more cost sensitive than AMOLED display applications and therefore cost effective thin film encapsulation can be an even more important enabler of the cost reductions that are essential for their competitiveness in the energy conversion marketplace. Currently, the cost of making PV panels is roughly US$1 per Watt so that panel cost is roughly $100 to $150 per square meter. The encapsulation cost should therefore be no more than about 10% to 15% of this and yet must last for at least 10 years and probably more than 20 years. Since the panels produce the most electricity when exposed directly to sunlight it is likely that most of these panels must be able to withstand exposure to the elements and dust, and large ranges of temperature (−10° C. to 80° C.). It is also essential that the encapsulation be able to expand to accommodate the substantial thermal expansion of the substrate. While very thin (<30 nm) inorganic films such as silicon dioxide and silicon nitride accommodate substantial expansion without cracking, thicker films often do crack.

Since the efficiency of such panels is critical to their cost-effectiveness, the panels would also strongly benefit by having anti-reflection coatings that could make the panels more efficient by reducing reflected light. Further, it would be helpful if an antireflection coating had an ability to resist scratching so that cleaning dust would not reduce the light transmission and efficiency. Such cleaning must be done several times a year to avoid efficiency loss. The sum of costs for all the above different coatings beneficial to the PV function should stay within the cost limits roughly of US$15 to US$20 per square meter. There are currently no known deposition processes that can produce the coatings within the cost limits. If such a process was found it would give an enormous boost to OPV and CIGS and to PV technology in general.

Therefore, for AMOLED displays, OLED lighting, and possibly some PV technologies a need for deposition methods for thin barrier films that have suitable bulk properties for low oxygen and water transmission rates. It is further necessary that such methods ensure excellent adhesion of encapsulation to the underlayers, and avoid formation of local defects due to imperfections in the starting surface. It is further necessary that the number of defects per square meter be of order 1 or less, and that the coating tolerate flexure—in some cases with very small bending radius—without micro-cracking, losing barrier function or peeling.

SUMMARY OF THE INVENTION

The present invention affords coatings of large substrates, continuous webs, or wafers with flexible, transparent, adherent multi-layer film structures having at least three thin layers that have one or more of the following economically important benefits:
  Hermetic coatings of materials and devices sensitive to air or moisture that are virtually pinhole and leak-free at highly competitive cost in mass production. Such coatings are more valuable if they are also tolerant of flexure without cracking and tolerant of very hot, moist conditions.
  Optical coatings of flexible plastic films that tolerate flexure and/or large temperature variations without de-lamination, micro-cracking or discoloration.

Hard, protective coatings on moisture sensitive or chemically sensitive devices that can withstand outdoor or highly variable temperature conditions without cracking or peeling.

Coating processes with one or more of the above qualities may be used for a range of specific applications with rapidly growing, cost-sensitive markets, including but not limited to:

1. Encapsulation of OLED display devices, whether on rigid or flexible substrates.
2. Encapsulation of OLED lighting devices.
3. Encapsulation and/or anti-reflective coating and/or hard coatings for thin film photovoltaic (PV) devices for outdoor energy harvesting. Among those benefiting most are modules or continuous web substrates having Organic PV films or Copper Indium Gallium di-Selenide (CIGS) PV.
4. Hard or protective coatings for plastic (including lowest cost plastics such as acrylic and PET) for windows or other outdoor utilization, where ability to endure large ranges of temperature and humidity without cracking or peeling is required.

BRIEF DESCRIPTION OF THE DRAWINGS

The present invention is further detailed with respect to the following drawings that are intended to show certain aspects of the present invention, but should not be construed as a limit on the practice of the present invention.

DETAILED DESCRIPTION OF THE INVENTION

Figure 1A:
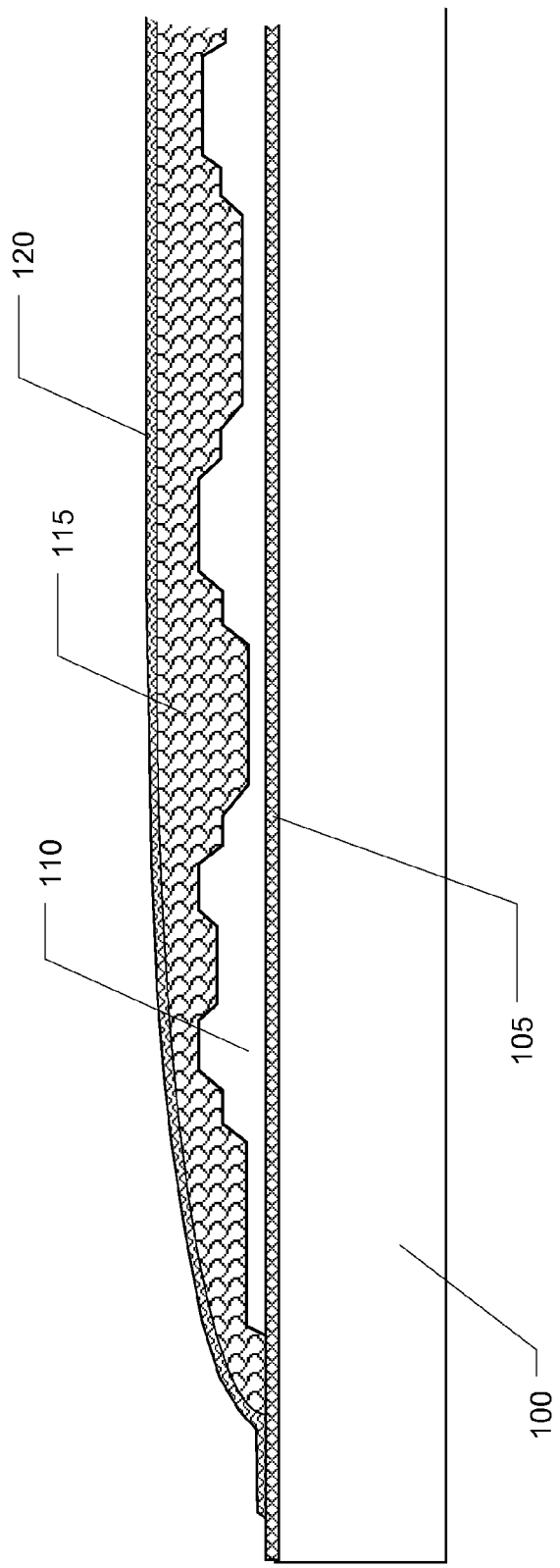
FIG. 1A shows a schematic cross-section representing the general features of an OLED device on a permeable substrate showing where barriers may be needed to protect the photo-active materials.

The present invention affords coatings of large substrates, continuous webs, or wafers with flexible, transparent, adherent multi-layer film structures having at least three thin layers that have one or more of the following economically important benefits:

Hermetic coatings of materials and devices sensitive to air or moisture that are virtually pinhole and leak-free at highly competitive cost in mass production. Such coatings are more valuable if they are also tolerant of flexure without cracking and tolerant of very hot, moist conditions.

Optical coatings of flexible plastic films that tolerate flexure and/or large temperature variations without de-lamination, micro-cracking or discoloration.

Hard, protective coatings on moisture sensitive or chemically sensitive devices that can withstand outdoor or highly variable temperature conditions without cracking or peeling.

An example of an application that benefits from this method is the need for ultra low permeability encapsulation of organic light emitting diode (OLED) displays and lighting. Another example is a coating for CIGS photovoltaic panels that protects from moisture and provides anti-reflection for incident light so that power output of the module is increased.

Coating processes with one or more of the above qualities may be used for a range of specific applications with rapidly growing, cost-sensitive markets, including but not limited to:

Encapsulation of OLED display devices, whether on rigid or flexible substrates.

Encapsulation of OLED lighting devices.

Encapsulation and/or anti-reflective coating and/or hard coatings for thin film photovoltaic (PV) devices for outdoor energy harvesting. Among those benefiting most are modules or continuous web substrates having Organic PV films or Copper Indium Gallium di-Selenide (CIGS) PV.

Hard or protective coatings for plastic (including lowest cost plastics such as acrylic and PET) for windows or other outdoor utilization, where ability to endure large ranges of temperature and humidity without cracking or peeling is required.

It is to be understood that in instances where a range of values are provided that the range is intended to encompass not only the end point values of the range but also intermediate values of the range as explicitly being included within the range and varying by the last significant figure of the range. By way of example, a recited range of from 1 to 4 is intended to include 1-2, 1-3, 2-4, 3-4, and 1-4.

As used herein, the term "approximately" is intended to include a value modified by the term within ±15% of the value in like units.

Embodiments of the invention disclose a method for forming multi-layered structures on polymeric or other materials that provide optical functions or protect underlying layers from exposure to oxygen and water vapor. Novel devices are also disclosed that may include multi-layered protective structures, AMOLED display, OLED lighting, or photovoltaic devices. An important advantage of the disclosed protective structures is that they do not crack or peel due to repeated flexure of the substrate or due to exposure to outdoor environments. The disclosed method and novel devices may include both cleaning and surface modification steps preceding deposition of the protective structure, and may also include, before depositing the protective structure, one or more deposition steps that provide a smoother surface upon which the protective structure is then deposited. The protective multi-layer structure itself may be made by depositing successively on a substrate at least three very thin layers of material with different density or composition. Embodiments of the structure may be made by alternately depositing harder and softer layers, or layers with greater and lesser concentrations of nitrogen or oxygen incorporated in the film. In certain embodiments of the disclosed methods for deposition of such film, the layers are deposited by varying the energy of ion bombardment per unit thickness of the film. Any layer of the structure may include one or more of the materials: silicon nitride, silicon oxide, silicon oxynitride, or metallic nitride or oxide.

In some embodiments for defect-sensitive encapsulation applications such as for OLED devices or other moisture sensitive devices the disclosed novel method produces substantially inorganic coating structures that are vacuum deposited multi-layer films with excellent resistance to permeation (better than $10^{-3}$ grams/meter$^2$/day) while having much better flexibility than conventional inorganic films. The disclosed method accomplishes this by substantially reducing pinhole leaks in the coating and eliminating microcracking of the coating when subjected to substrate flexing. The disclosed deposition process and method achieves this surprising and important flexibility even for inorganic films, notable in that flexibility is good for thicker barrier films, between 100 nm and 1000 nm thickness. Further, this is done for very low permeability films at very low substrate temperature by the disclosed method at much lower manufacturing cost than current or conventional techniques so that many important mass market products are made more competitive. In some embodiments coating flexibility may be even further enhanced by incorporation of a small amount of carbon doping ($CH_x$) into one or more of the layers during deposition of that layer or layers. The deposition method whether of pure inorganic or lightly carbon doped layers also substantially reduces pinhole leak defects arising near particles that are incorporated into the film in encapsulation processes; even after thousands of flexures. Such particles may originate in the coating system or result from prior processing and be on the substrate surface as it enters the coating system.

In some embodiments of the invention the coating structure is substantially a multi-layer silicon-based dielectric material, wherein the chemical composition of the layers changes only slightly from layer to layer while other film properties may change somewhat more from layer to layer than the composition. In some embodiments any individual layer may have thickness between about 5 nm and 200 nm. In some embodiments other material properties changing from layer to layer more than the composition may include material density, stoichiometry of principal constituents, microstructure and film intrinsic stress. In some embodiments thin layers of denser material having more compressive intrinsic stress that are highly impermeable may alternate with layers of less dense material having less compressive or tensile intrinsic stress that are more permeable. In some embodiments there may be variation in film stoichiometry from layer to layer in which only the principal constituents relative concentrations vary. One such example embodiment could be a silicon nitride film in which the ratio of silicon to nitrogen varied from about 0.65 in one layer to about 0.85 in other adjacent layer(s). There may as well be other changes in material properties from layer to layer including a small admixture or variation in concentration in some layers of one or more of the elements: carbon, oxygen, nitrogen, and fluorine that may not be a principal constituent of the film. In some embodiments of substantially silicon oxynitride or silicon nitride multi-layer coatings there may be layers having a greater admixture of oxygen (<20% of the nitrogen concentration) which alternate with layers having somewhat less oxygen (<5% of the nitrogen content). In some embodiments the more permeable layers may be substantially less permeable than comparable thickness of plastic, and even comparable or greater in permeability to conventional plasma deposited silicon dioxide. In some embodiments some layers of the structure may also have small amounts of dopants including: boron, arsenic, phosphorus, sulfur and metal dopants such as aluminum, zinc, tin, indium, copper, beryllium. In some embodiments of the invention the composition of the principal constituents of the layers may vary by less than 20% from one layer to the next. In some embodiments the layers may have only slightly varying index of refraction or light absorption difference less than 10%) from layer to layer so that visible light passes through the multi-layer stack of the coating without substantial internal interfacial reflection.

In some embodiments such coating structures may be formed by processes wherein some layers are exposed during deposition to a greater amount of ion bombardment relative to the rate of growth of the film on the surface, and other layers of material are not subjected to as much ion bombardment relative to the rate of growth of material on the surface. In some embodiments such layers may be deposited on moving substrates from a plurality of a given type of plasma source having substantially the same mixture of gases, but wherein the rates of deposition and ion bombardment power vary spatially along the direction of substrate movement. In some embodiments such multi-layer structures may be deposited on static substrates by sources in which either source power or gas mixture or both are varied in time in roughly a step-wise manner so that either the deposition rate or ion bombardment power or both vary from layer to layer. Such materials may be deposited in an alternating manner with abrupt changes between layers or with some scale length for layer property change due to a finite period of transition between layers in either ion bombardment power density or deposition rate, or both.

The ratio of ion bombardment power density to the rate of growth of the film is well known to be a factor in determining the density, microstructure and stress in plasma deposited films, and to a lesser degree the composition of such films. Thus, by varying the ratio of ion bombardment power to deposition rates during deposition of the film there will be a variation between some layers and others in the permeability and mechanical properties. In some embodiments where the bombardment and growth rates are steady or slowly varying, separated by rapid changes in time of either deposition rate or ion bombardment at or on the substrate, the film deposited will show layering with broader bands having constant properties and between them very narrow bands where the properties of the film transition.

In some embodiments the variation in properties from layer to layer may be achieved by changing the composition of the gas mixture in a roughly stepwise manner. In some embodiments the coating may be a silicon oxynitride material, wherein the concentration of nitrogen varies from one layer to an adjacent layer so that the moisture permeability is less in the layers having more nitrogen, and permeability is greater in layers having less nitrogen content. In some embodiments such layers of varying nitrogen content may also have varying density and microstructure.

In some embodiments this flexible coating structure is formed by positioning the substrate proximate to a plasma from which ion bombardment occurs as the coating process is taking place. In some embodiments the method of film formation is Plasma Enhanced or Plasma Assisted Chemical Vapor Deposition (PACVD or PECVD), wherein the amount of ion bombardment power upon the depositing film relative to the local deposition rate of the film may be greater for some layers and lesser for some intervening layers. In this manner there may be denser layers formed that are less permeable, which are interspersed with less dense layers that are more flexible and elastic. The greatly improved flexibility for the disclosed barrier may come in part from its multi-layered structure. This layering may impede propagation of microcracks and results in tolerance for flexure greater than in monolithic films due in part to increased tolerance for shear strain between layers—a bit like a "leaf" spring structure.

In some embodiments the ratio of ion bombardment to growth rate may vary roughly in steps between a lower value (A) and an upper value (B) through at least a part of the coating—ABABABA. In some embodiments the ratio may have values in multiple ranges, $X_1 < R_1 < X_2$; $Y_1 < R_2 < Y_2$; $Z_1 < R_3 < Z_2$, where each range constitutes a single type of film layer. In some embodiments there may be three such types of layer deposited in alternating fashion. In some embodiments such layers may be deposited in an order $R_1 R_2 R_3 R_1 R_2 R_3 R_1$ or other sequence of layers.

Changes in film properties between layers in some embodiments may be of varying abruptness over a thickness of less than 20% of layer thickness at the interface between layers. In some embodiments the properties may be caused to vary by changing through the thickness dimension of the film the instantaneous rate of growth of the film. In some embodiments the change in film properties from layer to layer may be achieved by varying the concentrations of species in the gas injected to the plasma. In some embodiments depositing material with properties in both types of layer may be accomplished simultaneously within a single plasma source wherein the rate of deposition varies along the direction of substrate motion, while the concentrations of gas phase depositing species also vary spatially along the same direction. In some embodiments depositing the different layers of the coating may be done simultaneously in a single plasma source, wherein the ion bombardment power density does not vary substantially within a plasma source, but the rate of deposition does vary spatially along the direction of motion within that same plasma source.

In some embodiments the variation in the ratio of the growth rate to the ion bombardment may be accomplished by varying the concentrations of different compounds in the gas which is supplied to the plasma, for example, the percentage of the flow of an inert gas such as argon may be varied to increase or decrease the ion bombardment relative to the deposition rate.

The change of the types of deposited materials from layer to layer results in such an encapsulation structure and composition that moisture penetration is strongly impeded while providing much more tolerance for substrate flexure.

In some embodiments of the disclosed method, the web or substrate is moved past a source or plural sources for film deposition in which film growth rate and/or ion bombardment vary within a source or from source to source primarily in the direction parallel to substrate motion, such that the ratio of growth rate to bombardment power density is not constant through the thickness of the film. In some embodiments the ratio of ion bombardment power to film growth rate as a function of the position in this direction may have one or more local minima, where the deposition rate is higher but the bombardment does not increase or may even decrease. Such layered films may in some embodiments be deposited from one or more linear plasma sources where the direction of substrate motion is approximately perpendicular to the long dimension of the source(s). In such a deposition system films may grow at a rate that varies as the substrate moves through the source. Further, there may be a structure within the source that causes ion bombardment power to also vary as a function of the position. In some embodiments there may be an independent and separately controllable source of power for ion bombardment that may be varied along the direction of substrate motion even as deposition gas flows and rates remain constant so that the film properties vary through the thickness of the film in the desired manner.

For ultra-sensitive materials such as OLED, surfaces upon which barriers are to be deposited inevitably have particles on them, which in many cases cause leaky spots with current barrier deposition methods. This is especially true for flexible substrates such as plastic films where such particles cause micro-cracks in hermetic coatings after flexure. The disclosed method overcomes thermal problems by the coating structure that is much more tolerant of flexing or stretching of all layers in the coating as the substrate flexes or expands. Further, the method can avoid defects from pre-existing surface particles by employing a sequence of steps, including the formation of novel multi-layer deposited structures as the hermetic barrier layer.

In specific embodiments of the invention, a coating is deposited that is multi-layer, mostly or entirely composed of silicon-based dielectric material. In some embodiments the multi-layers may be of transparent material each of whose layers may be thinner than about 200 nm, wherein the elements composing the layers are the same but the proportions of each element may change only modestly from at least a first type of layer (type 1) to at least one other type of layer (type 2). Other film properties, such as optical properties (refractive index & light absorption), permeability, hardness, elastic modulus, intrinsic stress and/or other mechanical properties may also change to a greater degree than the composition does from one type of layer to another. In specific inventive embodiments there may be three or more such types of layers (type 1, . . . , type n) that vary only modestly in composition from one type to another. In some embodiments there may be one or more layers in addition to the two or more types in the coating that may vary more substantially in composition, but may have one or more elements in common. In some embodiments there may be one or more thin layers (up to about 20 nm thickness) that may be formed from just-deposited material of the previous layer that have been subjected to a post-deposition treatment that may include ion bombardment or chemical modification—such treatment to provide surface smoothing on a nanoscale or microscale or modification of permeability and/or chemical stability at the surface. In some embodiments a layer may be deposited by a pulsed plasma in which the rf and/or VHF power may be pulsed at a pulse frequency of between about 100 cycles and 20 kilocycles. In some embodiments the type 1 layer material of the at least two types may have a thickness from 2 nm to 50 nm, and may be less permeable than materials in type 2 or other layers. The less permeable layer material may in specific embodiments have more negative (more compressive or less tensile) intrinsic stress. In some embodiments the layer material may be denser, and harder than the material in some other layers. The less permeable type of layer may be deposited so that the ratio of the ion bombardment power density to the rate of growth of the film is greater than for the type 2 or other layers of material. Surface treatment done after deposition may make a very thin sub-layer of the first, second, or other types of layer even more compressive due to ion bombardment. The second type or other layer material that is more permeable may not be as hard as the type 1 layer material. The type 2 or other layer of material may be from about 5 nm thickness to as much as 200 nm thickness. The layer material that is more permeable (up to several orders of magnitude) to moisture than type 1, may still be much less (up to several orders of magnitude) permeable than organic polymer or plastic. In some embodiments the second, more permeable, type of layer may also have been deposited with a lower ratio of the ion bombardment power density to the rate of film growth, so that each molecular monolayer of the deposited film has received less ion bombardment energy than a molecular monolayer of the first type of layer material. Furthermore, in some embodiments the less permeable layer material may have intrinsic stress that is compressive and whose absolute value is greater than about 50 MPa and the more permeable layer material may have intrinsic stress which may be tensile or less compressive than −100 MPa.

In specific inventive embodiments where the film is a silicon oxynitride, the less permeable layer material may have a greater elastic modulus, a greater hardness, more compressive intrinsic stress, and a smaller refractive index than the more permeable material. The elastic modulus, hardness, intrinsic stress, oxygen content, and refractive index may vary within the less permeable layer. In some embodiments oxygen content and refractive index may be greater in the more permeable layer. In some embodiments where the film is substantially silicon nitride, the less permeable layer may have greater elastic modulus and hardness, lower refractive index, greater nitrogen content and more compressive intrinsic stress. In some embodiments the more permeable layer may have a smaller elastic modulus and hardness, less compressive intrinsic stress, greater refractive index, and different nitrogen and/or oxygen content. Variations in characteristic mechanical properties from the first type of material to the second may exceed 100%, while optical properties and element composition may change by up to about 20%.

In specific inventive embodiments, the optical properties and mechanical properties may vary continuously through the thickness of a layer or group of layers of the deposited film due to a varying ratio of the ion bombardment power density to the deposition rate. This ratio of bombardment power density to deposition rate may vary periodically within a layer or from layer to layer. In some embodiments where maxima and minima are in adjacent layers—type 1 and type 2 layers alternating—each with a local maximum or minimum, and with resulting optical and mechanical properties having similar periodicity through the thickness of a group of layers. Such variation may also be alternating maxima and minima for three or more types of layers. The variation may be quasi-periodic with nearly equal deposited thickness between or at external ratios of bombardment to growth rate. The variation may as well be non-periodic and non-repeating with some alternation of regions having higher and lower refractive index (RI) or mechanical properties. The composition of the film may in this case also vary modestly through the films thickness, while remaining substantially the same material. The mechanical properties changing through the film thickness may include similar variation in hardness and elastic modulus.

In the inventive embodiments, surface treatment may be done after deposition of a group or groups of layers. Surface treatment may be done to type 1 or type 2 or other material. Surface treatment may be done at lower operating pressure in a plasma source that may be different in design from that used for depositing any of the layers.

The layered coatings of the inventive embodiments may be deposited in a wide variety of different plasma-based deposition systems that are capable of processing large substrates. In some embodiments layers of coatings may be deposited on moving substrates from a plurality of plasma sources being provided substantially the same gases, but wherein the rates of deposition and/or ion bombardment power density may vary spatially along the direction of substrate movement. In specific embodiments, the multi-layer structures may be deposited on static substrates by sources in which either source power or gas mixture or both the source power and gas mixture are varied in time in roughly a step-wise manner so that layers are deposited one upon another, wherein either the deposition rate or ion bombardment power or both vary from layer to layer. Furthermore, the layers may be deposited in an alternating manner with abrupt changes between layers or with some scale length for layer property change due to a finite thickness of transition between layers in either ion bombardment power density or deposition rate, or both. Materials in higher or lower permeability layers should not differ from one another in composition by more than about 20%.

The ratio of ion bombardment power density to the rate of growth of the film is well known in the art to be a factor in determining the density, microstructure and stress in plasma deposited films, and to a lesser degree the composition of such films. Thus, by varying the ratio of ion bombardment power to deposition rates during deposition of the film there will be a variation between some layers and others in their permeability and mechanical properties. In some embodiments where the bombardment and growth rates are constant or slowly varying for depositing the bulk of the layers, and separated by rapid changes in time of either deposition rate or ion bombardment on the substrate at the interfaces between layers, the film deposited will show layering with layers having almost-constant properties and between them very narrow bands where the properties of the film transition. In certain embodiments due to changing ratio of bombardment power density to growth rate, and/or changing gas mixture, as described above, up to 20% of the elemental composition of the film may change from any given type 1 layer to a type 2 layer that the film may be adjacent to.

In specific embodiments, the variation in properties from layer to layer may be achieved by changing the composition or ratio of components of the gas mixture in an approximately roughly stepwise manner. In some embodiments the coating may be a silicon nitride or silicon oxynitride material, wherein the concentration of nitrogen and/or the silicon nitrogen bond density varies by a modest percentage from one layer to an adjacent layer, and the moisture permeability is different in the type(s) of layers having more nitrogen from the permeability in type(s) of layers having less nitrogen content. In some embodiments the layers of varying nitrogen content may also have varying density, hardness, elastic modulus and microstructure.

In some embodiments this flexible coating structure may be formed by positioning the substrate proximate to a plasma from which ion bombardment occurs as the coating process is taking place. In some embodiments the method of film formation is Plasma Enhanced or Plasma Assisted Chemical Vapor Deposition (PACVD or PECVD). The greatly improved flexibility for the disclosed barrier may come in part from its multi-layered structure. This layering may impede propagation of microcracks and results in tolerance for flexure in the disclosed coating that is greater than in monolithic films due in part to increased tolerance for shear strain between layers—a bit like "leaf" spring structure. Further, the softer layers have substantially lower elastic modulus than for conventional or bulk silicon nitride and therefore elastically "stretch" more easily.

In specific embodiments of the inventive coating method, the ratio of ion bombardment power density to growth rate may vary roughly in steps between a lower value for type 2 material (A) and an upper value for type 1 material (B) through at least a part of the coating—ABABABA. In certain embodiments the ratio may have values in multiple ranges, $X1<R1<X2$; $Y1<R2<Y2$; $Z1<R3<Z2$, where each range constitutes a single type of film layer. If there are more than two types of layers of material—where a third type of material may be (C) there may be sequences such as ACBCACBCA, ACBACBACB, ACACBCBC, or other material layer sequences which are periodic, or more complex or non-periodic sequences such as ACBCBCAC. In certain embodiments there may be three such types of layers deposited in an alternating fashion.

In specific embodiments of the invention, transition in film properties from a layer to an adjacent layer may be of varying abruptness, such that the thickness of the transition may be up to about 50% of the thickness of an adjacent layer. In some embodiments the layer properties may be caused to vary from layer to layer as described above by changing in steps through the thickness dimension of the film the instantaneous rate of growth of the film while the ion bombardment power density changes relatively little. In some embodiments the change in film properties from layer to layer may be achieved by slightly varying the concentrations of different reactants or precursor gases in the gas mixture injected to the plasma. In some embodiments of a system for making the multi-layer structures, such as in-line systems, depositing material of the differing layers may be accomplished simultaneously within a single plasma source, wherein the power density of bombardment varies only slightly, or not at all, over the area of the substrate where the film is growing, but the rate of deposition varies more substantially along the direction of substrate motion.

In specific embodiments of the invention, variation in the ratio of the ion bombardment power density to growth rate may be accomplished by varying the percentage of the flow of an inert gas such as argon, or varying the gas pressure in the plasma source to increase or decrease the ion bombardment relative to the deposition rate. The change of the types of deposited materials from layer to layer results in an encapsulation structure and composition where at least one type of layer is a harder and/or denser material, and for which moisture penetration is more strongly impeded, while one or more types of layers may be softer so that softer layers provide much more tolerance for elastic deformation permitting greater substrate flexure. In some embodiments the layers may be configured so that the thickness ratio of the less permeable layers to the more permeable layers may be from about 1:20 to about 3:1—so that usually the less permeable layers are not much thicker than the more permeable types of layer(s), but the more permeable types of layers may be substantially thicker than the less permeable types.

In specific embodiments of the invention during the coating process, the ratio of ion bombardment power density to film growth rate as a function of the position along the direction of motion may have one or more minima, where the deposition rate is higher but the bombardment does not increase or may even decrease. Such processes may in some embodiments be done with a system having one or more elongated linear plasma sources arranged approximately parallel, where the direction of substrate motion is approximately perpendicular to the long dimension of the source(s). In some embodiments of the disclosed method, the web or substrate may be moved continuously or in steps past a source or plural sources for film deposition in which deposition rate and/or ion bombardment power density varies within a source, primarily in the direction of substrate motion, or from source to source. This will result in a ratio of growth rate to bombardment power density that varies in time for any point on a substrate being coated, and therefore, there may be a layering through the thickness of the film as disclosed herein. In some embodiments the source may have a structure that causes ion bombardment power to vary as a function of the position—this may be due to differing voltages on electrodes or a varying gap from parts of electrodes or different electrodes to the substrate. In some embodiments there may be an independent and separately controllable source of power for ion bombardment—such as an electrode under the substrate whose power density may vary along the direction of substrate motion even as deposition gas flows and rates do not change or change only slightly so that the film properties vary through the thickness of the film in the desired manner.

The coating process for either OLED or PV for any of the above applications, in some embodiments, may include various combinations of the process steps listed below. Typically, applications requiring ultraclean or defect-free coatings require more cleaning and surface preparation steps, and may benefit from multiple layers in the encapsulation. Coating applications that are not defect sensitive such as for optical coatings that are not hermetic encapsulations may require fewer or no surface cleaning steps, but may need deposition steps in which layer thicknesses are better controlled. In some example embodiments the temperature of the substrate may be less than about 150° C. Further, for OLED-based product manufacture the temperature should mostly be less than about 85° C. during the process. For example embodiments used for encapsulation of Organic PV (OPV) the substrate temperature should be kept below about 100° C. for the majority of the process time, and only very briefly and modestly above this temperature. Encapsulation for CIGS may typically be at temperatures less than 120° C.

In specific embodiments, the hardness of the type 2 layer may be greater than about 4 Giga-Pascals (GPa), while a type 1 layer as in may be as much as 20 GPa. The hardness average for the full thickness of the coating including both types of layers may be between about 5 GPa and about 12 GPa. (The hardness of conventional plasma deposited silicon nitride—typically deposited at temperatures between about 150° C. and 400° C.—can vary from about 10 GPa to about 22 GPa, while thermal deposited or bulk sintered silicon nitride, typically deposited at temperatures up to 1100° C. can have hardness up to about 30 GPa.) Thus, the hardness of the disclosed flexible coatings may be substantially less than that of sintered or thermally deposited silicon nitride while retaining significant capability to resist moisture penetration. In some embodiments, the thickness of the type 2 material as in layer may be greater than the thickness of the type 1 material as in layer so that the thickness-averaged hardness of the multi-layer coating may be closer to that of the softer layers than it is to the harder layers. In some preferred embodiments the hardness of the type 1 layers may be between about 8 GPa and about 16 GPa, and the hardness of the type 2 layers may be between about 5 GPa and about 10 GPa.

In certain embodiments the elastic moduli of the materials in the disclosed coating structure may vary from about 40 GPa to about 240 GPa with the average value through the thickness of the coating being between about 60 GPa and 160 GPa. This may be measured by using nano-indentation, then compensating for the effect of the elasticity of the stylus. The elastic modulus of the type 2 layers as in may range from about 40 GPa to about 130 GPa, while the elastic modulus of the type 1 layers as in may range from about 80 GPa to about 240 GPa. In specific embodiments, the elastic (Young's) modulus of the type 2 layers as in layer may range from about 55 GPa to about 110 GPa, while that of the type 1 layers as in may range from about 90 GPa to about 180 GPa. Typical elastic modulus for sintered and high temperature grown silicon nitride is typically between about 250 GPa and about 300 GPa, while that of lower temperature (150° C. to 400° C.) plasma deposited silicon nitride is typically between about 110 GPa and 200 GPa. Thus, the disclosed silicon nitride or silicon oxynitride multi-layer films are both for individual layers and for average elastic modulus typically somewhat easier to compress or stretch within elastic limits than high temperature thermal or sintered silicon nitride or higher temperature plasma-deposited silicon nitride. Intrinsic stress of the type 1 film layers may be in the range of between −50 MPa (compressive) and −500 MPa (compressive), while the intrinsic stress of the type 2 layers may be in the range of between −100 MPa (compressive) and +200 MPa (Tensile). The combined layers of the coating may have a combined intrinsic stress of between about −200 MPa (compressive) and about 50 MPa (tensile).

In some embodiments type 1 material may be deposited with a growth rate from about 10 nm per minute to about 200 nm per minute, while type 2 material may be deposited with film growth rates from about 20 nm per minute to about 500 nm per minute. In some embodiments of processes producing such coatings plasma source power densities (total rf+VHF power to electrodes divided by combined areas of substrate+electrodes+conducting walls in contact with plasma areas) for both type 1 and type 2 materials may be from about 0.05 Watts/cm$^2$ to about 1 Watt/cm$^2$, and in specific embodiments, in the range between 0.1 Watts/cm$^2$ and 0.5 Watts/cm$^2$. The ion bombardment power density on the substrate may be between about $\frac{1}{4}^{th}$ and about 2 times the source-average plasma power density. In some embodiments of the source design, the ion bombardment power may be a large fraction of the total power in the plasma, and the ion bombardment power density on the substrate may be greater than that on the electrodes. In some embodiments, the type 1 layers may be deposited with a lower deposition rate than the type 2 layers while having approximately equal ion bombardment power densities. In some embodiments both types of layers, types 1 and 2, as shown in may be deposited at the same time from a single plasma source or deposited at the same time by adjacent plasma sources, or deposited at different times by the same plasma source.

The type 1 layers being less permeable, may in some embodiments be a transparent material between 2 nm and 30 nm thick deposited to provide impermeable material to impede moisture transmission through the film. This layer may be deposited continuously or with interruptions during a period within which there may also be varying ratio of ion bombardment power density to deposition rate causing varying mechanical properties within any layer of the deposited material. The range of the mechanical properties, such as hardness or elastic modulus, within a type 1 layer is generally non-overlapping with the range of such properties in a type 2 layer. For coatings with three or more types of layers of like composition, the range of mechanical properties of a third or greater type may overlap with ranges for type 1 and type 2.

In specific embodiments as shown in a coating having type 1 and type 2 layers—and possibly other material layers—may be deposited in two groups, each having both type 1 and type 2 layers. Between deposition of the first and second groups of layers there may be a surface treatment that may or may not include deposition resulting in a very thin layer of a different material. In some embodiments the surface treatment may include a higher level of ion bombardment such that the exposed surface of the first set of layers is sputtered and smoothed by the ion bombardment. The type 2 layers within the group of layers alternate with the type 1 layers within this first group. The total thickness of the layers may be in the range from about 20 nm to as much as 2000 nm, and in specific embodiments, in the range between about 40 nm to 800 nm. Following deposition of the group there may be a surface treatment in which a very thin layer of the material within less than 10 nm of the surface is altered so that the surface becomes smoother on the microscale, nanoscale, or both. The treatment may include ion bombardment in which there may be sputtering of the surface material as well as smoothing of the surface topography. The treatment may also have some alteration of the composition of the very thin layer due to the ion bombardment or chemistry of such treatment. The treatment may also reduce roughness from any protrusions for particles or other surface irregularities. In some embodiments such a layer may be an additional very thin layer deposited upon the top layer of the group. The very thin layer may be deposited at a low rate while being subjected to substantial ion bombardment power density so that the surface of the thin layer is smoother on the micro or nanoscale than the surface was preceding deposition of the layer. The very thin layer in some embodiments may be deposited by a pulsed plasma. Upon the thin layer a second group of layers is deposited including type 2 layers and type 1 layers. The type 2 and type 1 layers may be deposited alternately, or in some embodiments may be in combination with other layers. Total thickness of the groups of layers as shown may be between about 100 nm and about 5000 nm.

In other embodiments of this invention, there may be one or more additional groups of type 1 and type 2 layers deposited upon the initial group. In some embodiments there may be three or more types of layers with a surface treatment done after deposition of the last layer of each group.

In some embodiments there may be variation in film stoichiometry of type 1 and type 2 layers in which changes in concentrations of the constituents combined comprise up to about 25% of the total composition. In some embodiments the mechanical properties of a type 1 or type 2 layer, in any succeeding group of layers, may vary through its thickness within the ranges as specified for type 1 and type 2 layers.

In one exemplary embodiment the composition of the type 1 or type 2 layers may be silicon nitride or silicon oxynitride in which the ratio of silicon to nitrogen varies from a minimum of about 0.65 in at least one type of layer to a maximum of as much as 1.0 in at least one other type of layer(s). In specific embodiments for silicon nitride, the ratio of silicon to nitrogen concentration may be in the range between about 0.65 and 0.8, while for silicon oxynitride the range may be from about 0.7 to 1.0. In some embodiments there may be changes in material composition from layer to layer as a small admixture or variation in concentration in some layers of one or more of the elements: carbon, oxygen, and fluorine the total of whose concentrations may comprise 20% or less of the total film. In some embodiments the type 2 layers, or others that are more permeable, may still be substantially less permeable than many other materials such as plastic, and may even be comparable or less permeable than conventional plasma deposited silicon dioxide. In some embodiments certain layers of the structure may also have small amounts of dopants that may include one or more of: boron, arsenic, phosphorus, sulfur, and metals such as aluminum, zinc, tin, indium, and copper.

Furthermore in some embodiments of the invention, the principal constituents of the different types of layers (for silicon oxynitride this may be silicon and nitrogen) may vary by less than 25% from one layer to the next. The different types of layers such as type 1 and type 2 may have only slightly differing indices of refraction (at 628 nm wavelength less than about 0.20 nm) at interfaces so that visible light passes through the multi-layer stack of the coating without substantial internal interfacial reflections.

Deposition Process and Architecture of the Coatings:

The deposition of any of the layers disclosed above in certain inventive embodiments may be done at substrate temperatures less than 150° C., and for some applications such as on many types of polymer substrates preferably at substrate temperatures less than 100° C. In some embodiments for sensitive substrates such as those carrying OLED devices, or some plastics, the deposition may be done at substrate temperatures less than 80° C. Deposition of oxides, oxynitrides, or nitride materials at substantial rates of deposition at such low substrate temperatures may be accomplished by using linear plasma sources having injection of reactant gases between pairs of electrodes as in the incorporated references. In some embodiments the deposition and surface treatment processes may be done in parallel plate deposition or high density plasma deposition systems. For the films precursor gases may include one or more of the following:

a. Precursors for depositing substantially inorganic silicon oxide or oxynitride: silane, disilane, methylated silanes, HMDSO, TEOS, TMCTS, BTBAS, VTMS, and HMDS. (Generally, large proportions—upwards of 20-to-1—of reactant are required with any of the organosilicon precursor compounds to make substantially inorganic films not having significant carbon inclusion.)

b. Precursors for depositing carbon-doped silicon oxide or oxynitride: combinations of [(silane or disilane or other silanes)] and [(methane or ethane or hydrocarbon or alcohols)]. or single precursors: methylated silanes, HMDSO, TEOS, TMCTS, BTBAS, VTMS, and HMDS.

c. Precursors for depositing carbon-doped silicon-based oxides or oxynitrides which may also be called carbon doped materials (>5% carbon—having more than about 5% polymeric content): HMDSO, TEOS, TMCTS, BTBAS, VTMS, and HMDS.

d. For depositing inorganic or carbon doped silicon nitride: Precursors: [combinations including (silane, or higher silanes or cyclic silicon-hydrogen compounds) and (methane, ethane, linear or cyclic hydrocarbons, or alcohols)] methylated silanes, BTBAS, and HMDS. (Generally, large proportions of oxidizer gas—upwards of 20-to-1—of reactant are required with any of the organosilicon precursor compounds to make substantially inorganic films not having significant carbon inclusion.)

e. Precursors for depositing carbon-doped silicon based nitrides having higher percentage of polymer content: [combinations including (silane, or higher silanes or cyclic silicon-hydrogen compounds) and (methane, ethane, linear or cyclic hydrocarbons, or alcohols)], methylated silanes and higher silanes, BTBAS, and HMDS.

f. Precursors for depositing inorganic or carbon-doped metallic oxides and oxynitrides: trimethyl aluminum, dimethyl zinc, trimethyl indium, tetramethyl tin, Tetrakis(t-butoxy) Hafnium, Tetrkis(dimethylamino) Titanium and others, Bis(indenyl)dimethyl Zirconium, tris-n-cyclopentadienyl yttrium. Generally, large flow ratios for reactant gases are required to yield substantially inorganic materials.

g. Precursors for depositing heavily carbon-doped (>10%) metal oxides and oxynitrides: trimethyl aluminum, dimethyl zinc, trimethyl indium, tetramethyl tin, Tetrakis(t-butoxy) Hafnium, Tetrkis(dimethylamino) Titanium and others, Bis(indenyl)dimethyl Zirconium, tris-n-cyclopentadienyl yttrium. Any of the above and may add with [methane, ethane, linear or cyclic hydrocarbons, alcohols and other volatile carbohydrates]

h. For depositing inorganic or carbon-containing metal nitrides: trimethyl aluminum, dimethyl zinc, trimethyl indium, tetramethyl tin, Tetrakis(t-butoxy) Hathium, Tetrkis(dimethylamino) Titanium and others, Bis(indenyl)dimethyl Zirconium, tris-n-cyclopentadienyl yttrium. Generally, large flow ratios for reactant gases are required with any of the organometallic precursor compounds to make substantially inorganic films not having significant carbon inclusion.)

i. Precursors for depositing carbon-doped metal nitrides having higher carbon content (>5%): trimethyl aluminum, dimethyl zinc, trimethyl indium, tetramethyl tin, Tetrakis(t-butoxy) Hafnium, Tetrkis(dimethylamino) Titanium and others, Bis(indenyl)dimethyl Zirconium, tris-n-cyclopentadienyl yttrium.

Layers of type 2 material deposited with smaller ratios of ion bombardment power to deposition rate, while not as effective barrier material as type 1 material may still assist multi-layer barrier function even with effective water vapor transmission rate (WVTR) from about $10^4$ g/m2/day to $10^{-3}$ g/m2/day. The type 2 layers do this not only by providing a flatter surface for the barrier layer to be deposited upon, but by greatly reducing the rate of moisture transport laterally between pinhole defects in different higher ratio type 1 material barrier layers, thereby providing a great advantage relative to organic polymer planarizing layers currently used in such processes as the VITEX process.

The processes for making the aforementioned inventive coatings, and the types and configurations of thin film deposition systems that can produce the disclosed advantageous coating are of great importance to the commercial success of the technology. There are at least several types or configurations of deposition systems that can produce these films which will be shown in the following figures.

A coating process for example embodiments for any of the applications of interest may include one or more of the following steps prior to deposition of the layered coating which may be in any sequence:

Physical cleaning of the surface of the substrate that may remove particulate contamination. In some embodiments this cleaning may be cryokinetic or gas-based. These methods have been proven very effective in removing loose or weakly bonded particles from the surface. Removal of such a high percentage of larger particles is highly beneficial to defect density of an encapsulation coating and the ability of such a coating to avoid cracking as the substrate is flexed with a bending radius less than 10 centimeters. Cryo-kinetic cleaning may be preferable since it has been shown to be exceptionally effective (>99% of particles larger than 100 nm in size) in particle contamination removal, while not exposing substrates or sensitive materials to moisture, oxygen or other contamination such as condensable organic compounds that might be damaging.

Surface smoothing of polymers or etching step for polymer-containing contamination using UV-based surface etching is intended to substantially reduce the size and/or number of organic particles on the surface, and flakes or protrusions from the surface of the substrate. This step reduces protruding organic materials by irradiating the surface with short wavelength UV radiation, mostly at shallow angles to the surface, so that it causes a minimum of erosion of the base organic material while having higher intensity and removal rate for protruding organic contaminants. Exposure to such hard UV, which may in some embodiments include Vacuum UV) may be accomplished by a light source with a window to prevent any exposure to the ionized gas used to generate the VUV. The UV radiation is in specific inventive embodiments at a wavelength so that photons have the energy to break bonds in the organic material. This radiation may also remove much of the gaseous surface contamination that may be undesirable such as adsorbed atmospheric gases and organic gases including hydrocarbons, solvents or carbon dioxide. This radiation also may break down and evaporate organic polymer that is often mixed with inorganic materials in small particles leaving substantially inorganic particles that are strongly bonded to the surface or partly immersed in it.

Surface activation or removal of atmospheric or organic gases from the surface and near surface region of the substrate that may be done by plasma exposure of the surface. For some polymers and plastics use of oxygen in amounts more than a few tenths of a percent will result in substantial surface modification and polymer backbone breaking. Even larger amounts greater than one percent oxygen can generally be done without concern for damage to the surface for some plastics having stronger backbone carbon chains, such as polyethylene naphthalene (PEN), or even polyethylene terephthalate (PET), but not for some plastics such as acrylics or PMMA.

Controlling material properties of the surface onto which encapsulation films will be deposited is needed particularly when coating plastics and polymers. In some types of polymers, particularly acrylic, this may be done in some embodiments by depositing an adhesion layer on the surface prior to deposition of the barrier. This provides better bonding sites for the material to be deposited which helps improve film adhesion. This may accomplish one or more things: avoid un-controlled mixing of organic (C or H) content from the underlayer into the deposited inorganic material; form an extremely thin, mixed organic-inorganic layer for the substrate that may provide a superior base upon which an inorganic hard coating can be deposited; avoiding ion damage to the polymer backbone of the under-layer in the near surface region that could affect the interfacial properties; and avoid liberating into the plasma ambient the mainly carbon and hydrogen due to ion bombardment during the early part of the ensuing thin film deposition step. In example embodiments this may be accomplished in the following ways:

After the surface preparation step(s) above, the deposition of the layers needed for encapsulation may begin, producing a flexible and, where desired, a highly impermeable multi-layer coating. In specific embodiments a cryogenic spray clean is done of the device surface before the encapsulation coating is applied.

Figure 1B:
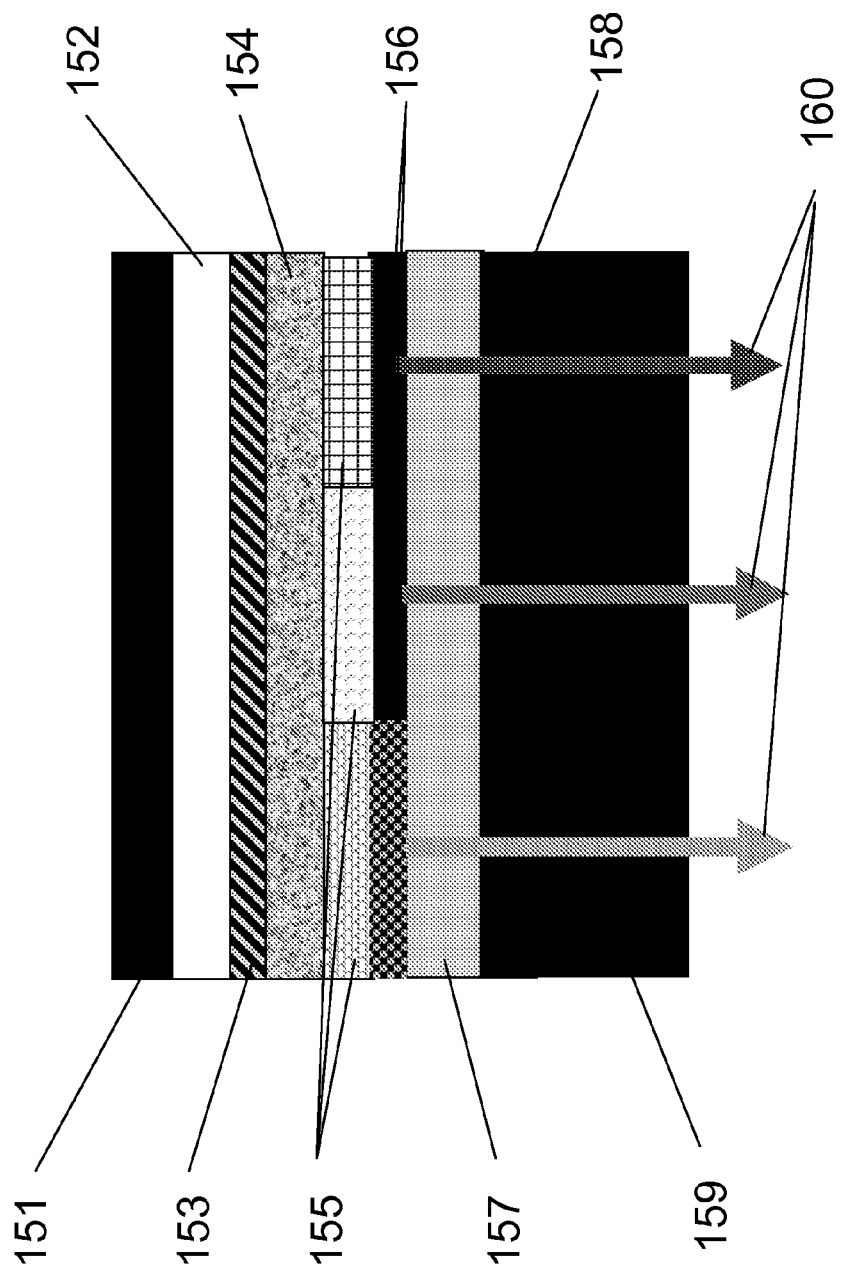
FIG. 1B illustrates an OLED device.

Referring now to figures, FIG. 1A is a schematic cross-section representing the gross features of a prior art opto-electronic device on a permeable substrate, 100, that has a barrier film, 105, below and above, 120, the photo active layers, 110. In this cross-section a planarizing polymer, 115, used in prior art encapsulation, and currently the predominant commercial technology, is also shown. The purpose of this polymer is to cover topography of the device surface and most particles and to protect the photoactive layer during the deposition of the barrier film. In FIG. 1B a more detailed structure of one kind of photonic electronic device—a prior art AMOLED display device is shown. In this device: the top layer of encapsulation or hermetic barrier, 151, shown as a single layer, covers the top conductor, 152, which may be a transparent conducting oxide (TCO) material and provides electric current for each pixel. The next layer of the OLED device is the cathode, 153, which has a low work function and injects electrons into the electron transport layer, 154, where the electrons are conducted to the OLED material, 155, which efficiently emits light when that individual pixel is to be turned on. The AMOLED produces light that is converted by the phosphor, 156, to the desired color of light for each pixel. The hole transport layer, 157, is immediately below the phosphor and is transparent, as is the bottom TCO layer, 158, that has been deposited directly on the glass, 159. The emergent light of each color and for each pixel, 160 transmits through the hole transport layer, bottom conducting layer and the (usually) glass substrate to the viewer.

Figure 2:
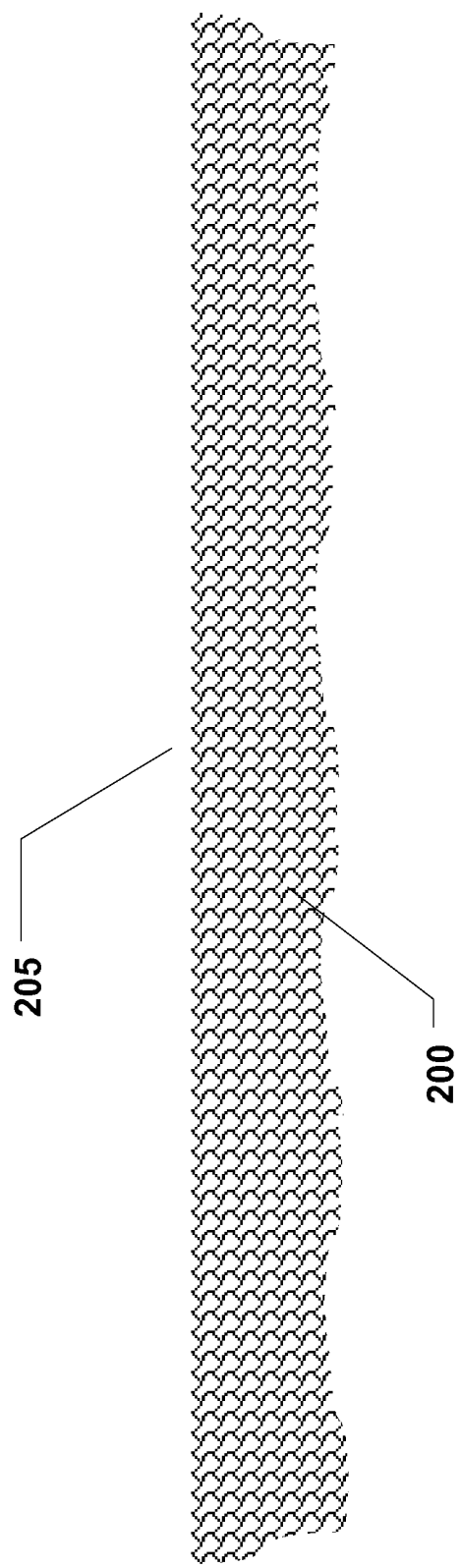
FIG. 2 illustrates an ideal starting surface for barrier deposition.
Figure 3:
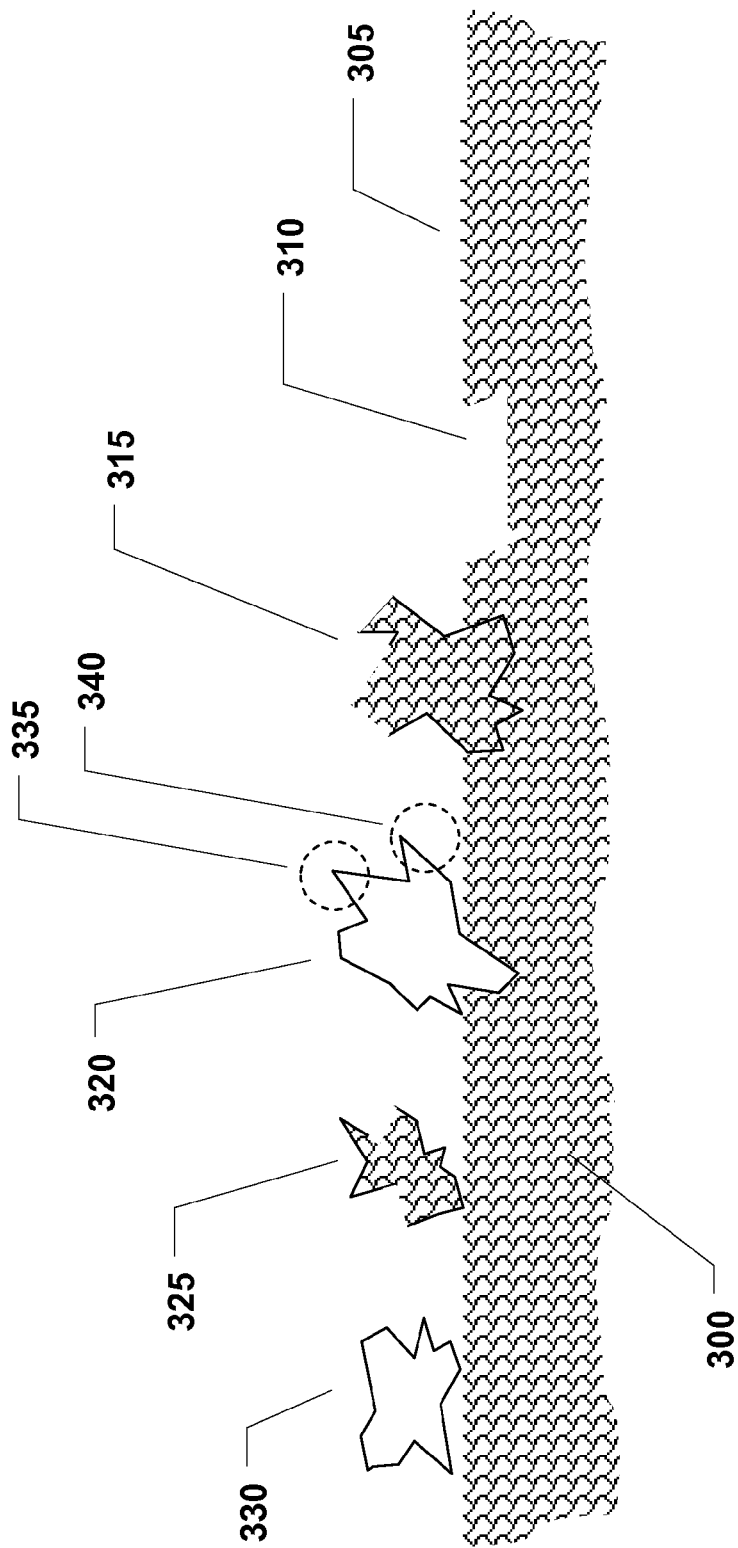
FIG. 3 illustrates a real surface with the imperfections that a barrier film deposition method must accommodate to reduce formation of localized defects.

FIG. 2 illustrates an ideal starting surface for a barrier layer deposition. The starting surface layer, 200, is smooth and of uniform composition without local defects and has a surface, 205, that has a uniform distribution of reactive sites that provide uniform nucleation and strong adhesion for the barrier layer. However, real substrate surfaces typically have at least some areas that are not ideal. FIG. 3 depicts a more realistic starting surface that illustrates the surface conditions that a barrier deposition method must overcome in order to greatly reduce formation of defective areas that permit penetration of oxygen and water. The realistic starting surface layer, 300, has areas where nucleation sites are not uniformly distributed, 305, and sites where the surface is not smooth, 310, due to non-uniform deposition of the underlayer that may also involve changes in nucleation site density. Such areas of non-uniform surface condition may cause the deposited barrier film to form a defective region with higher water vapor or oxygen transmission rates because the film is thinner, weakly bonded to the surface, or have an unfavorable composition, or a combination thereof. In addition to deposition uniformity issues there will also be particles on the under-layer that prevent uniform deposition of the barrier multi-layer structure. Particles may be embedded in the film during preceding steps and have a composition similar to the under-layer 315, or of a dissimilar material 320. For example, particles with similar composition to the starting layer may be flakes from material that deposited on walls or other surfaces inside the equipment during deposition of the starting layer material. An example of dissimilar particles would be metal flakes generated by moving mechanisms inside or outside the equipment used to deposit the starting layer material. If either type of particle arrives at the surface after the preceding layer material is in place, they may rest on the surface as non-uniform areas of similar composition, 325, or different composition, 330, from the starting layer. Particles may often have highly irregular shapes, in particular if the source is from flaking of deposits or metallic friction. This makes it highly likely that some particles will have asperities with acutely angled points, 335, and/or form reentrant regions, 340, that can cause defective areas in a deposited barrier film with higher gas permeability because the film will be thinner, weakly bonded to the surface, have insufficient density, a columnar structure due to insufficient ion bombardment, have an unfavorable composition, or any combination thereof. Also, the bonding of the thin inorganic plasma-deposited barrier layer to the material on the substrate surface may be difficult and require additional processing steps to create surface bonding sites to uniformly chemically bond the inorganic coating to the organic substrate surface. One problem that occurs commonly when such particles are incorporated into a flexible film is formation of microcracks or leaky spots after the material is flexed. Substrate flexure may cause the particle to move within the film in which it is embedded so that the fragile bonding of the surrounding layer to the particle is disrupted and gas conduction paths formed around the particle. It is desirable therefore to more firmly and seamlessly encase particles in the surrounding layer—this is done with a process step called smoothing that forces dense material to tightly bond around the particle between it and the rest of the film as it is formed.

The method of the invention integrates a series of steps that overcome problems due to contamination as illustrated in FIG. 3 to produce a high performance barrier with excellent adhesion and with a low defect density.

Figure 4:
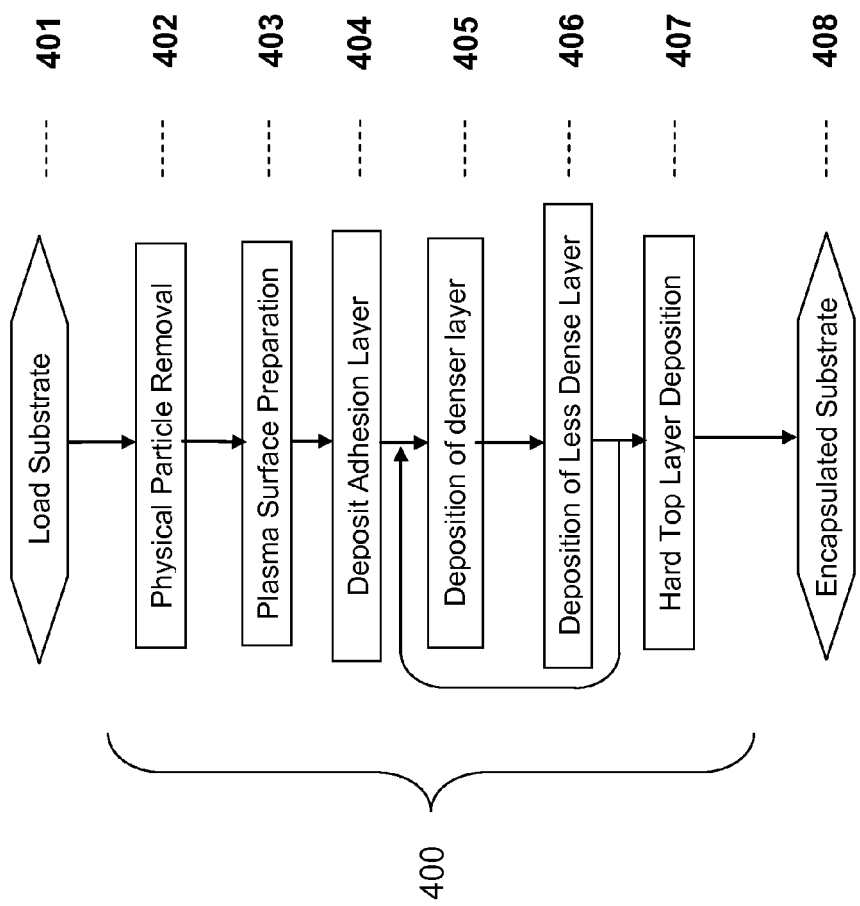
FIG. 4 shows a flow diagram that illustrates the possible steps in an embodiment of the high-performance barrier deposition method.

A schematic flow chart is shown in FIG. 4 that summarizes the sequence of steps for an example embodiment of the invention. The substrate is loaded 401 and at step 402 a physical cleaning is applied to remove surface particles not firmly embedded in the starting surface. Such particles may often be removed by methods that overcome the particle's attractive force to the surface and provide a means of transporting the loosened particle away from the starting surface. Some embodiments of this cleaning may use a spray of solid particles or droplets generated from high pressure (several or more times atmospheric pressure) liquefied gas such as $CO_2$, Ar, $N_2$ that is ejected in jets from nozzles. The liquefied gas rapidly cools after exiting the nozzle to generate solid or liquid particles entrained in the gas streams that can impact particles on the surface, dislodging the particles from the surface. Particles are then transported away from the surface and to an exhaust.

The step 403 is one of the process steps that provide surface conditioning. In some embodiments during step 403 the substrate is exposed to an inert gas plasma that forms dangling bonds at the solid surface, and further acts so that very loosely bound gases on the workpiece or substrate surface, including organics, may be desorbed and removed by the gas flow in the plasma sources. In some embodiments this may be done for substrates having an exposed surface of relatively weak-backbone organic polymer or plastic, such as acrylic, polycarbonate, or polypropylene. This may also be done for tougher polymeric materials such as polyimide (PI), fluoropolymers, polyethylene naphthalene (PEN) or polyethylene terphthalate (PET) that are transparent plastics that may be used as substrates for flexible electronic devices. In some embodiments a process gas for the may include nitrogen gas and a smaller amount of oxygen gas so that there is some chemical reaction at the surface of the polymer. This may promote adhesion of the film to be deposited to the backbone of the polymer.

The step 404 in some embodiments may deposit a very thin layer (less than about 20 nm) on the surface of the substrate to promote adhesion. In some embodiments this may include ion bombardment during or before deposition to drive some inorganic atoms into the material for improved bonding strength to the applied encapsulation layers. In some embodiments this may be done for substrates having an exposed surface of relatively weak-backbone organic polymer or plastic, such as acrylic, polycarbonate, or polypropylene. This process may cause silicon atoms from the deposited layer to be incorporated into the polymer backbone near the surface promoting adhesion of inorganic dielectric films deposited thereupon. This same step may also to a degree mitigate surface irregularities due to defects such as embedded particles, by smoothing the defects before starting the barrier deposition.

The step 405 deposits a dense and impermeable barrier layer of transparent material, which in some embodiments may be a silicon-based or metal-based dielectric. The barrier layer is deposited while providing greater power of ion bombardment resulting in densification of the material. This helps provide a denser barrier for prevention of chemical permeation. The energetic ion bombardment may be done while depositing the entire thickness of the layer. In some embodiments this layer is very thin—less than about 200 nm. In some embodiments this layer may be substantially silicon nitride and have a reduced proportion of nitrogen relative to true stoichiometric silicon nitride. In some embodiments the deposited film may be "sputtered back" during or after deposition so that a thinner layer remains upon completion of the step. The next step 406 may in some embodiments be deposition of a softer and more elastic layer made with a lower ratio of ion bombardment to deposition rate than that deposited in step 405. This layer may also be a barrier for moisture and oxygen penetration, but in some embodiments is not as impermeable as the more bombarded layer below it. The layer deposited in step 406 along with layer deposited in step 405 may be silicon nitride, silicon oxynitride or other oxide or nitride material that is modestly resistant to moisture and oxygen permeation. These two preceding steps may be repeated in an alternating manner thereafter until the encapsulated device has the needed level of resistance to moisture, chemical and/or oxygen transmission. Finally, in some embodiments a covering layer may be deposited that is a hard material such as silicon dioxide or aluminum oxide or other. The covering layer may be thinner than the barrier or softer layers but should be at least 10 nm thickness.

The steps shown in FIG. 4 may be divided into three groups: first, in which there is removal of material from the surface by kinetic, chemical reaction or bond breaking; second, steps in which there is surface treatment or modification; and third in which there is net deposition of successive thin layers of material effected by plasma action on an injected gas mixture and with ion bombardment.

In some embodiments of this method the first type of step may contain one or more of the following:

Surface cleaning of the substrate with a non-wet, physical cleaning method. This is more likely to remove larger particles (>1 micron size) and less likely (though still have some effectiveness) in removing particles less than 0.1μ. For cryo-kinetic cleaning techniques the removal probability for larger particles has been shown to be very high, exceeding 99%, while for particles of diameter less than 50 nm it may be less than 90%. In some example embodiments the cleaning should be done with the substrate in thermal communication with a temperature controlled pedestal or drum so that substrate temperature may be better controlled during the cleaning process and to avoid damage to the materials or structures on the substrate. Further, the total flux of spray to the substrate surface should be such that the rate of heat transferred (cooling) from the substrate does not exceed 5 Watts per square centimeter. In some embodiments of the cleaning process, the total flow of cooled gas to the spraying element per unit area of substrate covered is limited to assure the substrate temperature is maintained above −20° C., and in some inventive embodiments between about 40° C. and above about 0° C., throughout this process step.

The second type of step includes surface treatment or conditioning with the purpose of preparing for the thin film deposition that is to follow. The surface treatment in some embodiments may be done with the invention from the same inventors disclosed in related US applications 2011/0005681 A1, 2011/0005682 A1, and 2011/0006040 A1.

The second type of treatment involves plasma-based surface cleaning, surface activation and adhesion layer deposition. In this process the surface of the web or substrate is first exposed to a plasma containing at least one of the gases argon, nitrogen and helium and having at most a small concentration (<10%) of oxygen or other oxidizer. In some embodiments the plasma may be at a gas pressure between about 5 Pascals and about 1000 Pascals. The total flow of gas may be in the range between 100 SCCM per meter of electrode length and 5000 SCCM per meter. The plasma may be generated in some embodiments by linear plasma sources, in an evacuated chamber in which one or more antennae or electrodes are supplied with microwave, VHF or rf power to generate a soft plasma. The power supplied to these antennae or electrodes may range from 0.05 Watts/cm$^2$ to 1 Watts/cm$^2$. The substrate or web may in some embodiments move continuously or in a periodic manner past the plasma sources. The treatment may cause atmospheric gases or organic solvents in the very near-surface region of the substrate or on the surface to be removed. The treatment may further cause dangling bonds to be formed at the substrate surface thereby making the substrate surface substantially hydrophilic. The treatment may also provide modestly energetic ions and electrons to the surface as well as some activated neutral species, but not much bombardment by ions with energies above about 10 eV so that there is negligible sputtering of the substrate surface.

The adhesion layer process may be done in a deposition system with parallel plate or linear plasma sources under conditions where deposition of silicon or metal compounds is usually done. Gas pressure may be between 10 Pascals and 1000 Pascals; gas flows of gas including argon and nitrogen, but not including oxygen, may be from 100 standard cubic centimeters per minute (SCCM) to 5000 SCCM per meter of length, and in particular inventive embodiments between 500 SCCM and 3000 SCCM per meter for a linear source; rf power density may be from 0.05 Watts per square centimeter of electrode area to 2 Watts per square centimeter of powered electrode area, and in particular inventive embodiments between about 0.1 Watts and 0.6 Watts.

In a second part of the adhesion layer process, knock-on implant of silicon or metal atom may be done after deposition with inert ion bombardment of high current density between 0.5 mA/cm$^2$ and 10 mA/cm$^2$, and in particular inventive embodiments between 1 mA/cm$^2$ and 5 mA/cm$^2$. The inert ion bombardment can be achieved in a linear plasma source of width between 5 cm and 30 cm with gas pressure between 1 Pa and 50 Pa, and total gas flow between 10 SCCM and 1000 SCCM per meter of source length. In some inventive embodiments, argon may be a substantial constituent of the plasma for the sake of efficiency of silicon implantation—between at least 10% of the total gas flow, and in other inventive embodiments more than 50%. In some embodiments, the average rf power per unit area of the source may be from 0.05 Watts/cm$^2$ and 2 Watts/cm$^2$, and in other inventive embodiments between 0.1 Watts/cm$^2$ and 0.5 Watts/cm$^2$. In some embodiments where the linear plasma source has a separate source of bias power on the substrate, the range of bias power for this implantation process divided by the area of that substrate that is biased should be from about 0.2 Watts/cm$^2$ to 5 Watts/cm$^2$, and in particular inventive embodiments from 0.2 Watts/cm$^2$ to 2 Watts/cm$^2$. When using this separate source of bias power to the substrate, the rf power to the upper electrodes of the source may be reduced—or even eliminated. This provides within about a minute or less an ion dose sufficient to implant the silicon into the underlying organic layer to a dose of at least $10^{14}$ to $10^{17}$ ions/cm$^2$ in the top 10 nm, a volumetric dose of $10^{20}$ ions/cm$^3$. In this case the integrated bombarding ion exposure may equal a dose of energetic ions (E>100 eV) between $10^{17}$ ions per square centimeter and $10^{19}$ per square centimeter. Generally, higher ion doses are required for helium ions and nitrogen ions than for argon ions to produce the same implanted silicon or metal dose in the substrate material.

The third group of steps—those that include substantial deposition of layers of the encapsulation—in some embodiments may be done using the plasma sources or generating units (from the same inventors) disclosed in USPTO applications 2011/0005681 A1, 2011/0005682 A1, 2011/0006040 A1. The third group of process steps include as described below: thin film deposition of a first type of layer with a high ratio of ion bombardment power density to deposition rate to produce some of the less permeable layers within the encapsulation structure; and deposition of a second type of layer, in some embodiments having a smaller ratio, to produce more flexible layers. The layers may in some embodiments have higher compressive stress and/or higher density. In some embodiments a multi-layer structure combining both types of layer results in hermetic encapsulation superior in flexibility and less pinhole leaks than the prior art. In some embodiments for encapsulation requiring ultra-low defects, there may be more than one layer of each type in some alternating arrangement so that the resulting film has even fewer pinhole leaks of moisture. In specific embodiments a cryogenic spray clean is done of the device surface before the encapsulation coating is applied.

The first type of barrier layer being less permeable may in some embodiments be a transparent material between 5 nm and 1000 nm thick deposited to provide impermeable material to impede moisture transmission through the film. This layer may be deposited continuously or with interruptions during a period within which there may also be varying degrees of relatively high ion bombardment power to deposition rate causing densification of the deposited material. The rate of deposition of the material need not be constant during the course of the layer being deposited. The combination of deposition and ion bombardment has two benefits: first, it helps the film adhere better to particulates and irregularities on the substrate surface, and second reduces the slope of the surface of the deposited material and of protrusions or underlying material. The combination of deposition and ion bombardment provides a smoother substrate for succeeding layers to be deposited thereupon. This layer, when completed, may cover surface particles and other irregularities partially or completely. Thirdly, it improves the density and impermeability of the material.

In some embodiments the layer may be deposited at low substrate temperatures by a plasma enhanced chemical vapor deposition (PECVD) method. The deposited layer may be a layer whose thickness, homogeneity, structure and composition depend on encapsulation requirements. The primary function of this layer is as a barrier to moisture and chemicals that may permit moisture penetration between about 0.001 g/m$^2$/day to $10^{-8}$ g/m$^2$/day.

In some embodiments the layers may be a pure inorganic material that may be thin (5 nm to 100 nm) and may in some embodiments principally contain at least one of the following constituents: silicon dioxide, aluminum oxynitride, aluminum oxide, zinc oxide, tin oxide, zinc-tin oxide, titanium oxide, titanium oxynitride, silicon nitride, and silicon oxynitride. In some embodiments this material may also contain a very small percentage of carbon—such that the carbon content as a fraction of the total of (silicon+metal+carbon) is less than about 1%. In applications where flexibility of the substrate or end product is important, the thickness may be in particular inventive embodiments between 5 nm and 600 nm. In some embodiments some layers may be deposited in a manner that the deposited material is subjected to intense ion bombardment so that the layer has compressive intrinsic stress above 100 MPa, and in some embodiments between 300 MPa and 1000 MPa. The second type of layers within this structure are deposited with less intense ion bombardment relative to deposition rate of other layers, and may have an intrinsic stress below 100 MPa. In some embodiments the average intrinsic stress over the full thickness of the multi-layer encapsulation coating may be between about +20 MPa (Tensile) and about −200 MPa (compressive stress). In preferred embodiments the average intrinsic stress for the combined layers will be less compressive than 100 MPa. (0>Stress>−100 MPa).

Lightly Carbon Doped.

In some example embodiments the multi-layer encapsulation structure may have some layers with modest carbon-doping of 0.5% to 5% in an otherwise substantially inorganic material. The layers may be thicker (30 nm to 1000 nm) than pure inorganic structures while retaining film flexibility. Carbon content may in preferred embodiments be in the range of between about 1% and 3%. In some embodiments carbon content may vary from layer to layer, and in more heavily ion bombarded or thinner layers there may be substantially less carbon than in less heavily ion bombarded and thicker layers. The total thickness of the structure, in this case with mixture of carbon and inorganic content, may in particular inventive embodiments be between 50 nm and 500 nm to keep fabrication cost low. This mixed material is more flexible and elastic than pure inorganic layers of the same thickness, and therefore may be helpful in applications where the substrate may have a greater rate of thermal expansion, or need to tolerate flexure with small bending radius. Applications may include thin film photovoltaics such as CIGS and Organic photovoltaic modules, or flexible OLED applications for barriers.

Process control parameters for the multi-layer structure will depend on which type of process step is being done. In some embodiments the ion bombardment power density for an in-line or R2R deposition system may be roughly the same throughout the deposition chamber(s) but there may be a variation in the rate of deposition of the material so that the ratio of ion bombardment to deposition rate may vary substantially. In some embodiments the deposition rate may vary from as much as about 500 nm per minute to as low as 10 nm per minute. In some embodiments layers receiving a higher ratio of ion bombardment power density to film deposition rate may be deposited at approximately equal gas pressure to those layers having a lower ratio—where both pressures may be between 3 Pa and 500 Pa and in particular inventive embodiments between 5 Pa and 200 Pa. In some embodiments the higher bombardment power density ratio layer deposition may be done at lower gas pressure than the lower bombardment power ratio layer deposition, or with more argon gas diluent so that the bombardment may be increased while the deposition rate may be the same or decreased. In some embodiments the deposition of higher and lower ion bombardment power density ratio layers may be done successively in a deposition system where the substrates are static and the system may use parallel "plates" (conventional PECVD system or HDPCVD) to form the plasma covering the entire substrate, and that provides depositing species and ion bombardment of the growing film. In some embodiments of the parallel plate system deposition of such successive layers of varying ratio of ion bombardment power density to deposition rate may be done by varying either film deposition rate or the ion bombardment power density or both from deposition of the first type of layer to the second type of layer.

Process gases for a silicon nitride-based multi-layer film may include one of silane, disilane, hexamethyldisilazane or other silicon containing precursor not containing oxygen. Further, reactant gases may include nitrogen, ammonia or other nitrogen containing gases not having oxygen. In some embodiments either process step may be done with inert gas (Ar) that may be up to 50% of the total gas flow. Total gas flow including both reactant and precursor gases and diluents may be from 50 SCCM per meter to 5000 SCCM per meter, and in particular inventive embodiments between 200 SCCM and 2000 SCCM. RF power density may be between 0.05 Watts/cm$^2$ and 5 Watts/cm$^2$, and in particular inventive embodiments from 0.1 Watts/cm$^2$ to 2 Watts/cm$^2$. Radiofrequency or VHF electric power may be supplied both to a plasma source facing the side of the substrate getting coated and possibly as well as a bias electrode adjacent to and facing the opposite side of the substrate. In some embodiments the rf or VHF power applied to the bias electrode may be at a different excitation frequency than that applied to the plasma source facing the substrate surface to be deposited upon. Deposition process steps for the second type of layer with lower ratio of ion bombardment power density to deposition rate may be done under similar process conditions to higher power density ratio layers, but ion bombardment may be lower, or deposition rate may be higher with roughly equal ion bombardment. While requirements for material deposition may affect pressure and gas flow ranges process control parameters for both types of layers will be within above stated ranges.

For this process in example embodiments the gases used may include as precursors: silane or disilane from 0.1% to 20% of total flow and in particular inventive embodiments between 1% and 10%; and reactants: argon from 0% to 50% and in other inventive embodiments from 5% to 25%, nitrogen from 20% to 75% and in other inventive embodiments from 40% to 75%; ammonia from 0% to 10% and in other inventive embodiments from 0.5% to 5%; and oxygen from 0% to 10% and in other inventive embodiments from 0% to 1%.

Either Layer of the Barrier Coating

Either layer of the barrier coating may in some embodiments contain a silicon-based compound such as silicon nitride, silicon oxynitride or silicon oxide. In some embodiments the multi-layer encapsulation coating may contain a metal compound containing at least one of: aluminum, titanium, zinc, tin, zirconium, indium, yttrium, or hafnium, or contain both silicon and metal. The barrier material may be deposited from various precursor gases by plasma enhanced deposition. Being deposited on top of the smoothing structure described above, the barrier film may be exposed to moderate to intense ion bombardment during deposition. In some embodiments the bombardment may not be at levels sufficient to cause substantial sputter etching of the film (as in the smoothing structure), but yet sufficient power density to make the deposited layer properly densified, homogeneous and resistant to gaseous diffusion.

In some example embodiments the ion bombardment power may be substantially greater during deposition of some layers so that the sputter-etch rate may be up to half the concurrent deposition rate. The final net thickness of the layers may be very minimal—as little as 5 nm to 10 nm—so that the highly compressive material formed may be too thin to cause substantial distortion of the substrate or device. Such narrow bands within the barrier layer may be helpful in arresting the propagation of defects—in some cases stemming from small incorporated particles—that would otherwise propagate vertically within the growing layer and compromise barrier performance. In some embodiments where the barrier total thickness is between 200 nm and 1000 nm—such dense, more compressive layers may be repeated from two to twenty times to assure highest quality barrier material and minimize leaks. Further, since the sublayers are so thin the total thickness of the barrier coating may be from 50 nm to 100 nm.

Inorganic.

In example embodiments the complete barrier structure may be an entirely inorganic, and non-polymeric material.

Lightly Carbon-Doped.

In some embodiments the barrier layer may contain at least one of an oxynitride or nitride of one or more of: silicon, aluminum, titanium, tin, zinc, indium, zirconium, hafnium and yttrium, along with additional content between 0.5% and 5% of carbon. In some preferred embodiments carbon (as a fraction of the total of silicon+metal+carbon content) may be in the range between about 1% and 3%. The addition of the carbon to the films, even in such small concentrations, increases the yield strain level of the films—elasticity—and decreases the brittleness of the films. Such mixtures can be more tolerant of flexure or stretching than purely inorganic films. Such barrier layer may in some embodiments be much thicker than the pure inorganic layer described immediately above. This material may be advantageously employed as barrier material for weatherable and/or flexible coatings of all types, including but not limited to photovoltaic encapsulation and OLED encapsulation. For OLED or for PV such thicker barriers may advantageously permit effective, leak-free encapsulation for larger particles not adequately covered and smoothed by the smoothing structure.

Figure 5:
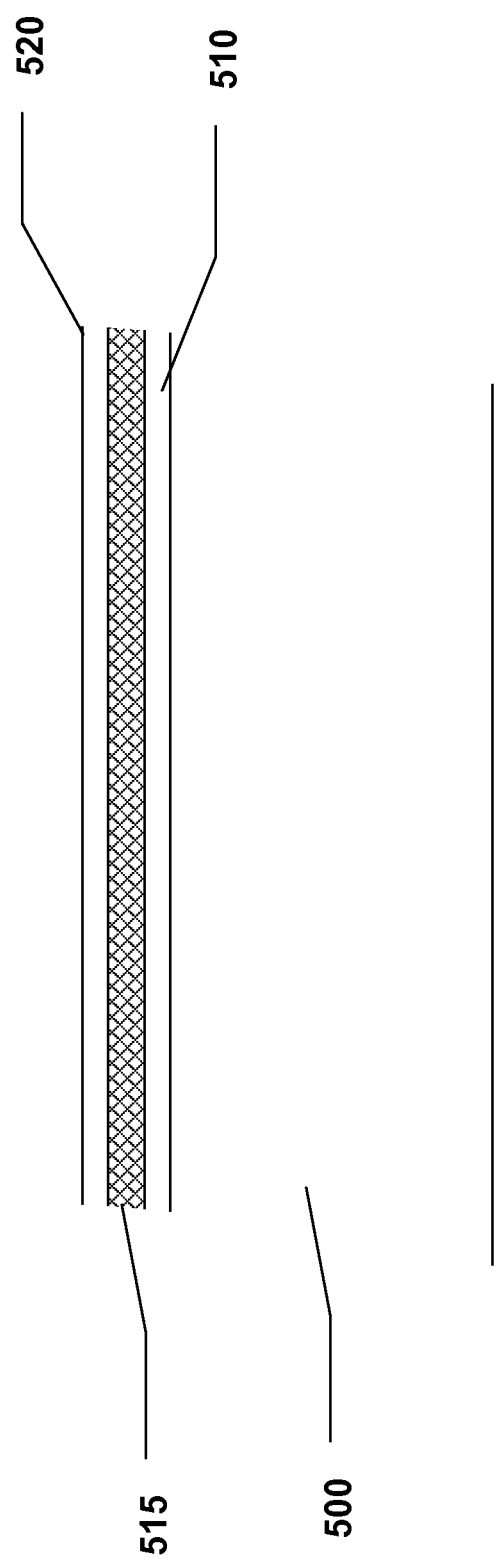
FIG. 5 shows a cross section view of a coating structure suitable for encapsulation of highly moisture sensitive devices.

FIG. 5 illustrates a substrate 500 with a 3 layer encapsulation upon it. There is a first dense layer 510 substantially of silicon nitride with a small percentage of oxygen content. This first layer in some embodiments may be deposited with a low deposition rate between about 10 nm/minute and 50 nm per minute, with feed gases including reactants nitrogen and ammonia and precursor gas including one of: silane and di-silane. In some embodiments the power density of ion bombardment is in the range between 0.1 Watts/square centimeter and 1 Watt per square centimeter; with total silane flow to the source between about 10 standard cc per minute and 50 standard cc per minute per meter of source length. Upon this was deposited a layer 515 that is thicker and received less ion bombardment relative to the deposition rate, and which is more tolerant of strain. This layer may be more permeable than the first layer but still may have a permeation rate less than 0.01 grams/meter squared/day and finally a second barrier layer 520 which has received substantial ion bombardment during deposition or just after.

Figure 6:
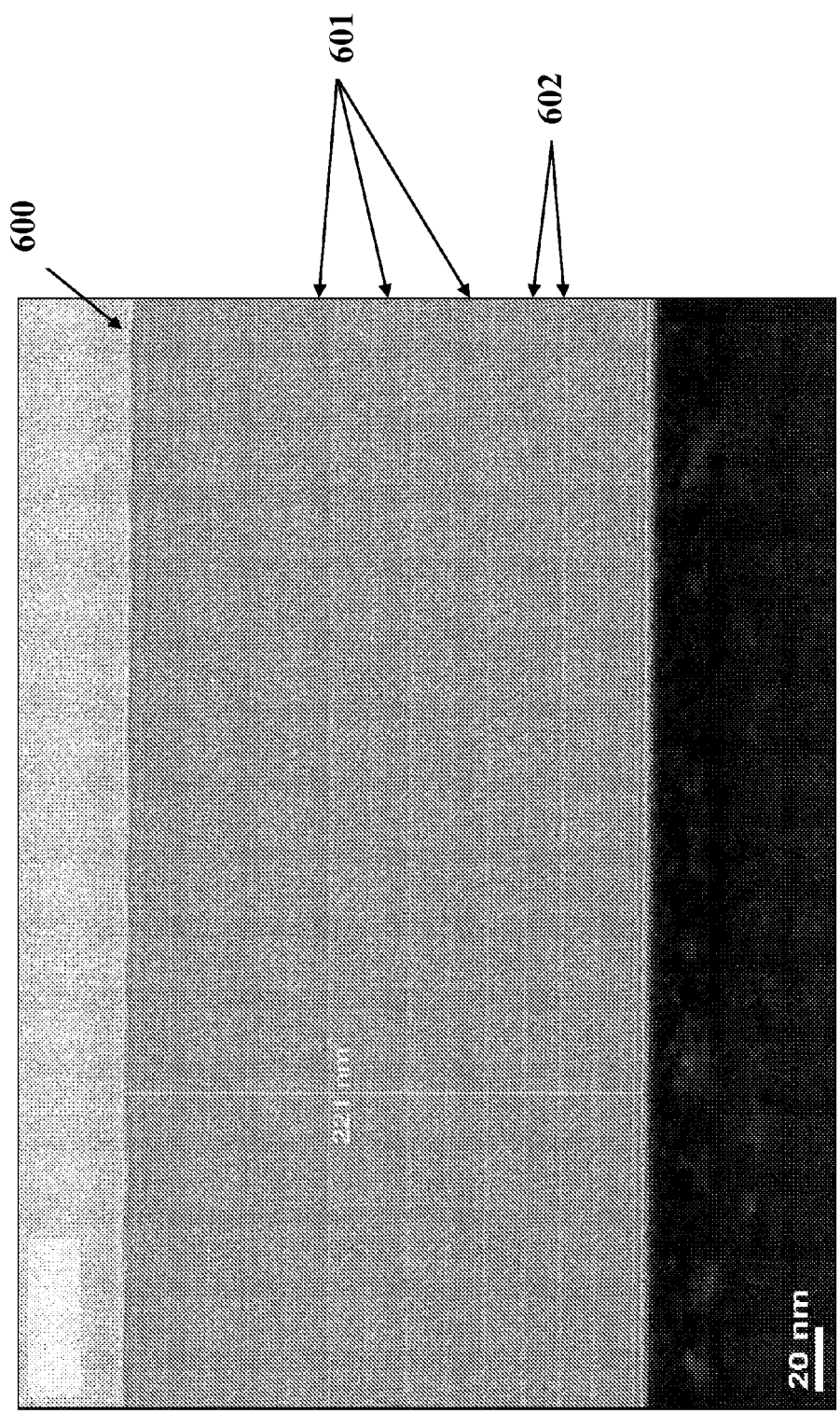
FIG. 6 shows a transmission electron micrograph (TEM) of example multi-layer encapsulation film where harder denser layers are darker and softer layers are lighter.

FIG. 6 shows a transmission electron micrograph (TEM) of a cross section of a multi-layer barrier structure 600 substantially of silicon nitride. This film has about 13 relatively thicker layers of harder material 601 which is darker in the picture, and 14 layers of lighter colored material 602 that is thinner and softer.

Figure 7:
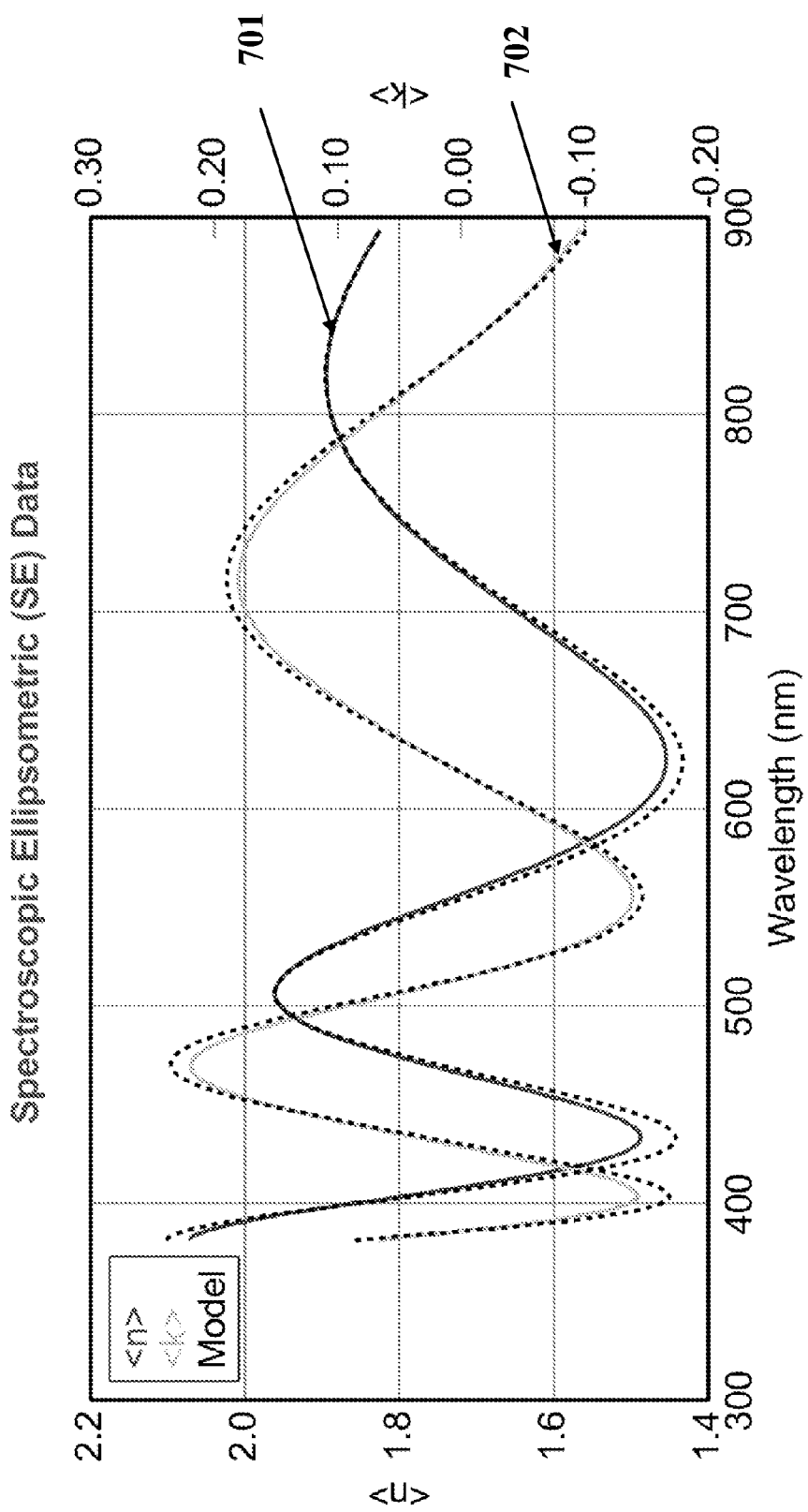
FIG. 7 shows the refractive index and absorption coefficient versus wavelength of light obtained by ellipsometry for an example coating structure of silicon nitride.

FIG. 7 shows an ellipsometry measurement of a silicon nitride film having 10 layers that is about 200 nm thick. Shown is the curve for the refractive index (RI) 701 and the extinction coefficient 702 for this film. It is apparent that the RI peaks are above 1.8 which is normal for silicon nitride films made by plasma enhanced deposition at higher temperatures such as 300° C. to 400° C., and has demonstrated excellent moisture barrier properties.

Figure 8:
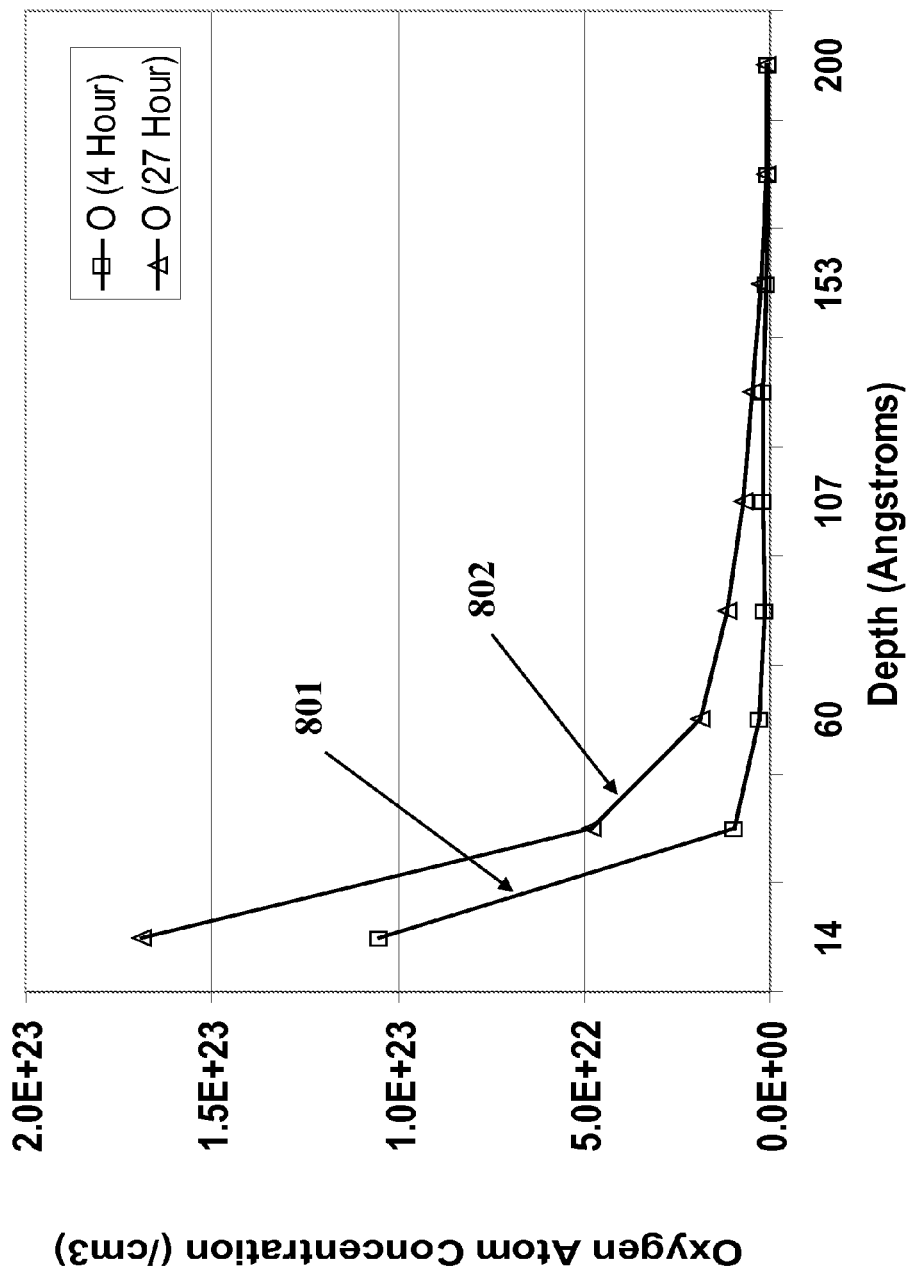
FIG. 8 shows a Secondary Ion Mass Spectrograph (SIMS) analysis of a multi-layer silicon nitride barrier film showing oxygen content versus depth after exposure to boiling water.

FIG. 8 shows a measured oxygen atom concentration in a silicon nitride film that was exposed to a 95° C. ambient having nearly 100% relative humidity. This is an exceedingly aggressive environment for accelerated life testing of moisture barrier films. The oxygen that is measured shows that moisture has very slightly permeated no deeper than about 40 Å—a very short distance—into the silicon nitride after 4 hours of exposure to the environment as shown in curve 801. After an additional 23 hours of exposure, curve 802 shows that moisture has permeated to a slight extent only about 100 Å. This is indicative of the excellent barrier performance of the multi-layer silicon nitride film. This film at a thickness of 2000 Å has been shown by rigorous, calcium-based bending tests to avoid cracking for at least 10000 flexures about a bend radius of 2 centimeters. This is a truly exceptional level of flexibility for such a film and unprecedented for an inorganic film of this thickness.

Figure 9A:
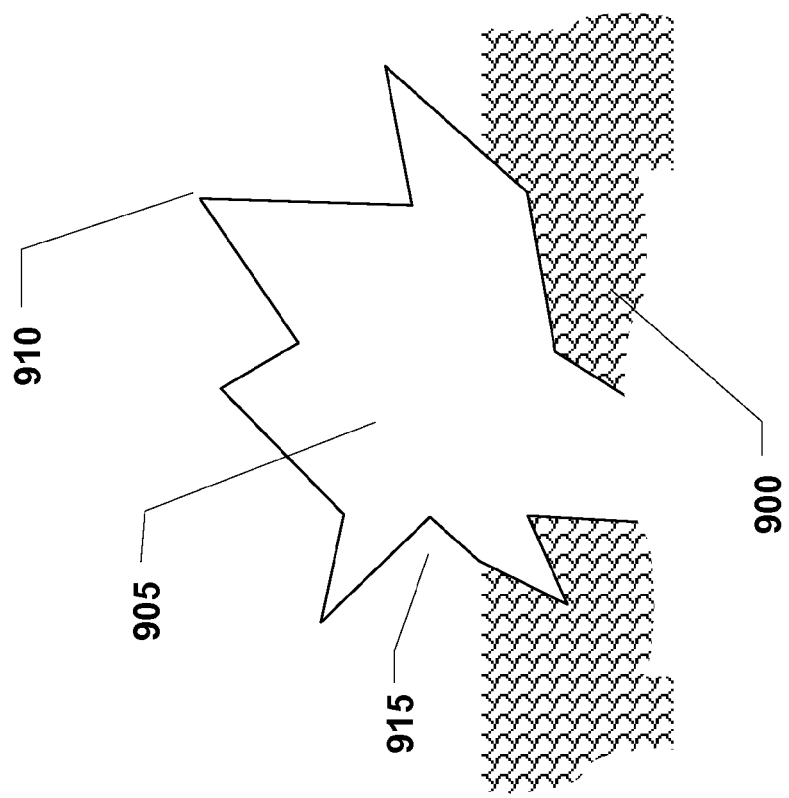
FIG. 9A shows on a microscale a common particulate on a contaminated surface as it comes for encapsulation process and FIG. 9B shows this same particle after partial encapsulation by the disclosed method and process.
Figure 9B:
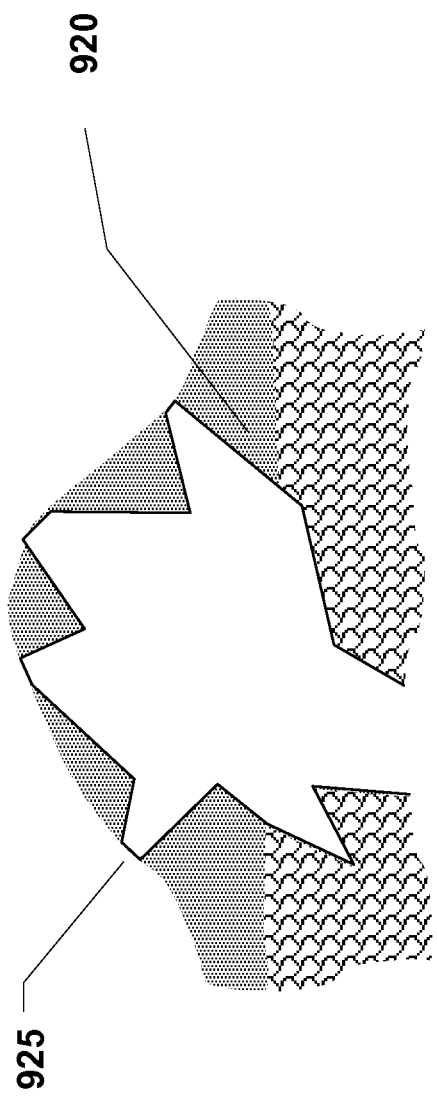

FIG. 9A shows a particle 905 partially imbedded in a soft top layer 900 where there exposed pointed features 910 and surface regions with overhanging material 915. This same particle has been partially covered in FIG. 9B with a first layer of barrier material that was deposited with a high ratio of ion bombardment to deposition rate. It is evident that some pointed features 925 have been truncated and smoothed while overhang regions 920 have been filled.

Layers of type 2 material deposited with smaller ratios of ion bombardment power to deposition rate, while not as effective barrier material as type 1 material may still assist multi-layer barrier function even with effective Water Vapor Transmission Rate (WVTR) from about $10^{-1}$ g/m2/day to $10^{-3}$ g/m2/day. They do this not only by providing a flatter surface for the barrier layer to be deposited upon as illustrated in FIG. 10, but by greatly reducing the rate of moisture transport laterally between pinhole defects in different higher ratio type 1 material barrier layers providing great advantage relative to organic polymer planarizing layers currently used in such processes as the VITEX process.

The processes for making such coatings, and the types and configurations of thin film deposition systems that can produce the disclosed advantageous coating are of great importance to the commercial success of the technology. There are several types and configurations that can produce these films which will be shown in following figures. In all these figures the process control parameters are generally within the same ranges as described above. The gas pressure range, the range of gas flows per area of substrate, the rf power density per area of electrode and the relative flows of reactant and precursor gas will generally be in the same ranges for reactors shown schematically in FIGS. 10 through 14. Below are approximate ranges that apply to systems shown in FIGS. 10-14.

The deposition rate may vary from as much as about 500 nm per minute to as little as 10 nm per minute.

Gas pressures may be from 3 Pa to 500 Pa and in particular inventive embodiments from 5 Pa to 200 Pa.

Process gases for a silicon nitride-based multi-layer film may include one of silane, disilane, hexamethyldisilazane or other silicon containing precursor not containing oxygen.

Further, reactant gases may include nitrogen, ammonia or other nitrogen containing gases not having oxygen. In some embodiments either process step may be done with inert gas (Ar) that may be up to 50% of the total gas flow Total gas flow including both reactant and precursor and diluents may be from 50 SCCM per meter to 5000 SCCM per meter, and in particular inventive embodiments between 200 SCCM and 2000 SCCM.

RF power density may be between 0.05 Watts/cm$^2$ and 5 Watts/cm$^2$ and in particular inventive embodiments from 0.1 Watts/cm$^2$ to 2 Watts/cm$^2$.

Radiofrequency or VHF electric power may be supplied both to a plasma source facing the side of the substrate getting coated, and possibly as well as a bias electrode adjacent to and facing the opposite side of the substrate. In some embodiments the rf or VHF power applied to the bias electrode may be at a different excitation frequency than that applied to the plasma source facing the substrate surface to be deposited upon.

For this process in example embodiments the gases used may include as precursors: silane or disilane from 0.1% to 20% of total flow and in particular inventive embodiments between 1% and 10%; and reactants: argon from 0% to 50% and in other inventive embodiments from 5% to 25%, nitrogen from 20% to 75% and in other inventive embodiments from 40% to 75%; ammonia from 0% to 10% and in other inventive embodiments from 0.5% to 5%; and oxygen from 0% to 10% and in other inventive embodiments from 0% to 1%.

Figure 10A:
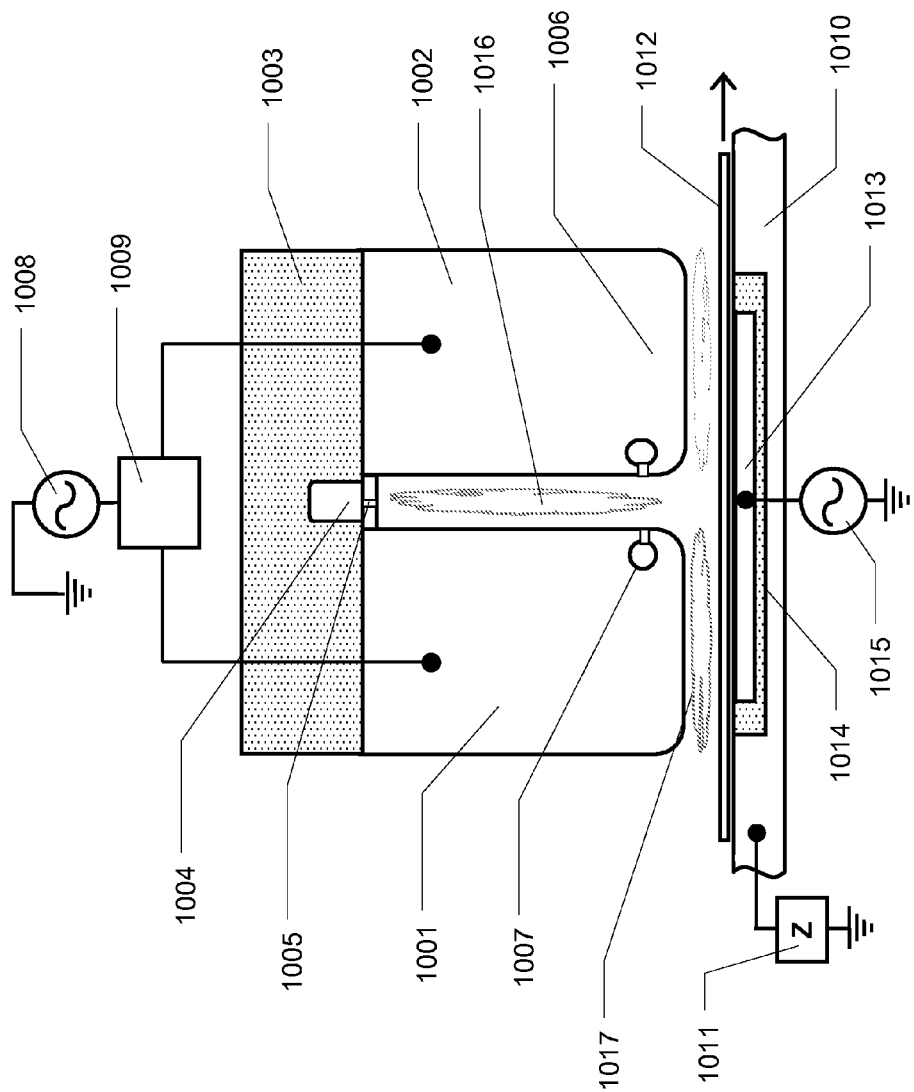
FIG. 10A shows in cross section a configuration of an elongated plasma source that may be used for making a coating. This source has substantially parallel elongated linear electrodes, where rf power and gas are provided the linear source and a layer of the coating may be applied to the substrate.

Shown in FIG. 10A is a cross-sectional view of an exemplary plasma source. In some embodiments the source configuration shows a gap of 5 mm to 40 mm between elongated electrodes, 1001, and 1002, each of which is at least four times as long as its width or height as shown in the figure. The electrodes are supported by an insulating standoff, 1003, so that between these electrodes and substrate 1012 the minimum gap may be between about 5 mm and 40 mm. The gap between the electrodes and substrate in some embodiments may be less than the width of the electrodes (measured along the direction of substrate motion, from left to right in the figure). In some embodiments the gap between the electrodes may be less than the height of the electrodes. The ratio of the minimum gap between the electrodes to that between the electrodes and substrate may be from ¼ to approximately 4, and in other inventive embodiments between ½ and 2. AC power that may be at one or more frequencies in the rf and VHF bands is provided to the electrodes from a supply 1008 and delivered through a matching network 1009 which may include one or more of: transformer, filter and/or splitter for the power so that both electrodes are powered and in some embodiments the phase angle between the AC power to the electrodes is greater than about 90°. A reactant gas or mixture may be supplied to a manifold 1004 in the standoff and the gas then is injected through small holes or slot(s) 1005 and flows down between the electrodes toward the substrate and is activated in the plasma 1016 sustained therein. A second gas which may contain at least one precursor for film deposition is injected from manifolds 1006 and 1007 into the downward flowing gas where the second gas mixes and reacts to produce species that form the film deposited upon the substrate. After the gas stream flows between the electrodes, the gas stream flows under the electrodes between them and the substrate wherein there is a plasma 1017. The intensity or power density of the plasmas 1016 and 1017 may be independently controlled so that the concentrations and energies of neutral and ionic species are suitable for the chosen process. The substrate moves over a pedestal 1010 that may be grounded through an impedance Z, 1011, that is less than 10 Ohms in magnitude. AC power is supplied to a lower electrode 1013 by an independently controllable source 1015, which may be at a different frequency or frequencies than the ac power provided to the electrodes 1001 and 1002. The source of power to the lower electrode may include impedance matching and splitting of the current to more than one such electrode. Electrode 1013 may be greater than the width or height of one of the upper electrodes, and may be insulated by a dielectric 1014 from the pedestal, as electrode 1013 is positioned underneath the gap between electrodes. A single pass of a substrate through such a source at a speed less than about ⅕ cm per second might be sufficient as a multi-layer barrier or encapsulation. This is because the films deposited as a point on the substrate passes under the substrate-facing sides of the electrodes will be lower in deposition rate but at least as high in ion bombardment power density as material deposited as the same point passes under the gap between the two electrodes. If such a substrate is passed under the source shown in FIG. 10A the substrate will first have deposited on it a very thin film layer having higher ion bombardment power density ratio to deposition rate (type 1 layer) as the substrate passes under the first electrode and then as the substrate passes under the gap between the electrodes where the deposition rate is much higher—as much as 5 times higher—a thicker layer of softer and less compressive material is deposited so that a deposited layer is a somewhat thicker type 2 material layer. Then as the point moves under the second electrode the substrate will have a second thinner layer (type 1 material) deposited with higher ratio of ion bombardment power density to deposition rate.

Figure 10B:
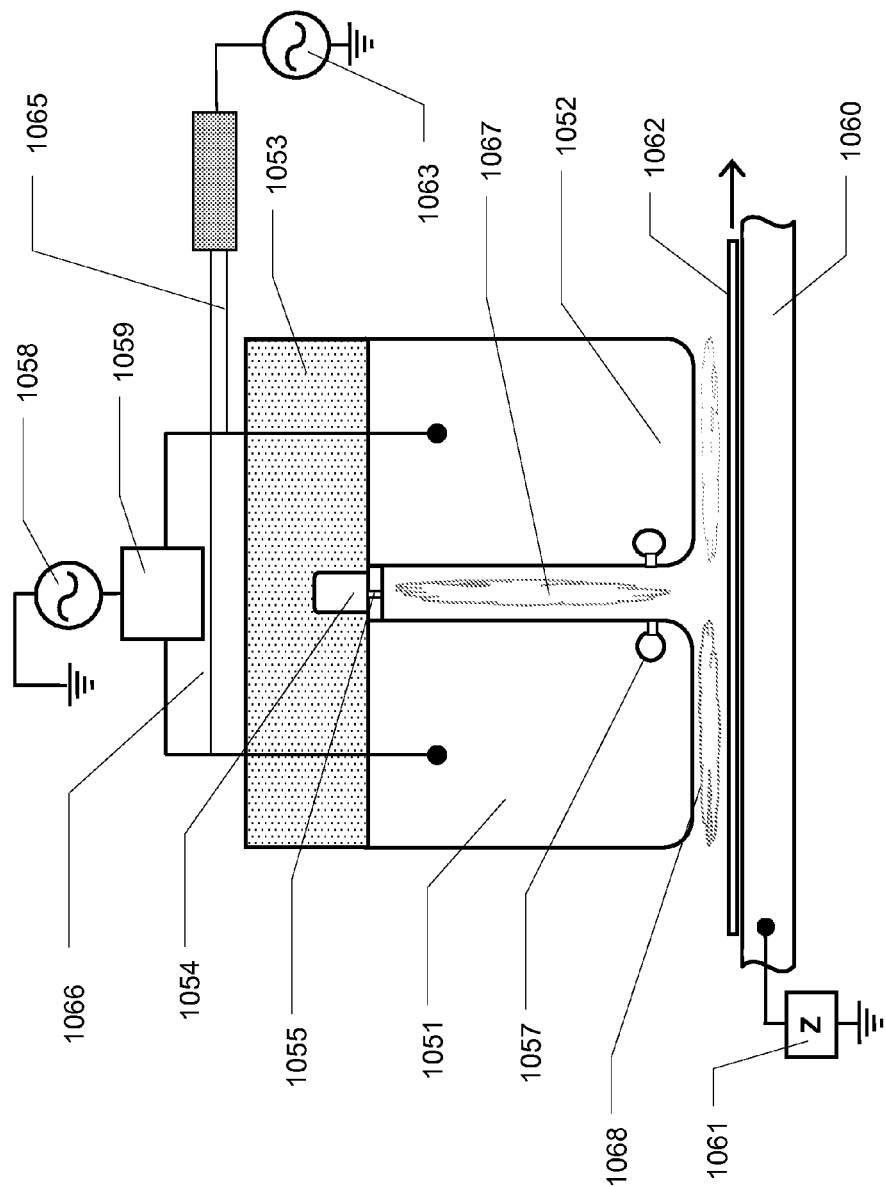
FIG. 10B shows a source having no electrode adjacent the opposite side of the substrate from that being coated, but which has a second ac power supply connected to both electrodes, which may be at a different frequency than the first power supply, and which may be split between the electrodes in a way that the phase difference between the electrodes is different than the phase difference of ac power provided by the first power supply.

FIG. 10B is a cross-sectional view of an embodiment of a plasma source 1050 for carrying out coating processes. In some embodiments the source configuration shows a gap of 5 mm to 40 mm between elongated electrodes 1051 and 1052, each of which is longer than its width or height that are shown in the figure. The electrodes (1051, 1052) are supported by an insulating standoff, 1053, so that between these electrodes and substrate 1062 the minimum gap may be between about 5 mm and 40 mm. The gap between the electrodes (1051, 1052) and substrate in certain embodiments may be less than the width of the electrodes (measured along the direction of substrate motion, from left to right in the figure). In some embodiments the minimum gap between the electrodes (1051, 1052) may be less than the height of the electrodes 1051 and 1052. The ratio of the minimum gap between the electrodes (1051, 1052) to that between the electrodes (1051, 1052) and substrate 1062 may be from ¼ to approximately 4 and in specific embodiments, between ½ and 2. AC power that may be at one or more frequencies in the rf and VHF bands is provided to the electrodes (1051, 1052) from a supply 1058 and delivered through a matching network and secondary circuit element 1059 which may include one or more of: transformer, filter and/or splitter for the power so that both electrodes are powered and in some embodiments the phase angle between the AC power to the electrodes is greater than about 90°. A reactant gas or mixture may be supplied to a manifold 1004 in the standoff and the gas then is injected through small holes or slot(s) 1005 and flows down between the electrodes (1051, 1052) toward the substrate and is activated in the plasma 1067 sustained therein. A second gas which may contain at least one precursor for film deposition is injected from manifold 1057 in electrode 1051 and its counterpart in electrode 1052, into the downward flowing gas where it mixes and reacts to produce species that form the film deposited upon the substrate. After the gas stream flows between the electrodes, the gas flows under the electrodes (1051, 1052) between the electrodes (1051, 1052) and the substrate 1062 wherein there is a plasma 1068. RF or VHF power per unit surface area to the electrodes and gas pressure in the processing region may be substantially within the ranges given above so that mechanical, permeability and optical properties of the films may be within the desired ranges for the encapsulation films.

Continuing with FIG. 10B, the intensity or power density of the plasmas 1067 and 1068 may be independently controlled by varying the power to the two different power supplies—1058 that concentrates most power between these electrodes to plasma 1067, while supply 1063 delivers power more in phase to electrodes 1051 and 1052 and so provides most of its power to the plasma 1068 between electrodes (1051, 1052) and substrate 1062. The substrate moves over a pedestal 1060 that may be grounded through an impedance Z, 1061, that is less than 10 Ohms in magnitude. Notably, there is no powered electrode in the pedestal 1060. Power supply 1063 may be at a different frequency or frequencies than the ac power provided by supply 1058. The second source of power to the electrodes may include impedance matching and splitting of the current to more than one such electrode.

Process control parameters in the embodiments of plasma sources shown in FIGS. 10A and 10B for any layer of the multi-layer structure for a given type of deposition system will depend on which type of process step is being done. In some embodiments, the ion bombardment power density for an in-line or R2R deposition system may be roughly constant within the deposition region but there may be a variation in the rate of deposition of the material so that the ratio of ion bombardment to deposition rate may vary substantially. In certain embodiments, the deposition rate at a point within the deposition system may vary from as high as about 500 nm per minute to as low as 10 nm per minute. In some embodiments layers receiving a higher ratio of ion bombardment power density to film deposition rate may be deposited at approximately equal gas pressure to those layers having a lower ratio—where both pressures may be between 3 Pa and 500 Pa and in specific embodiments, between 5 Pa and 200 Pa. In some embodiments the higher bombardment power density ratio layer deposition may be done at lower gas pressure than the lower bombardment power ratio layer deposition or with more argon gas diluent so that the bombardment may be increased while the deposition rate may be the same or decreased.

Figure 11:
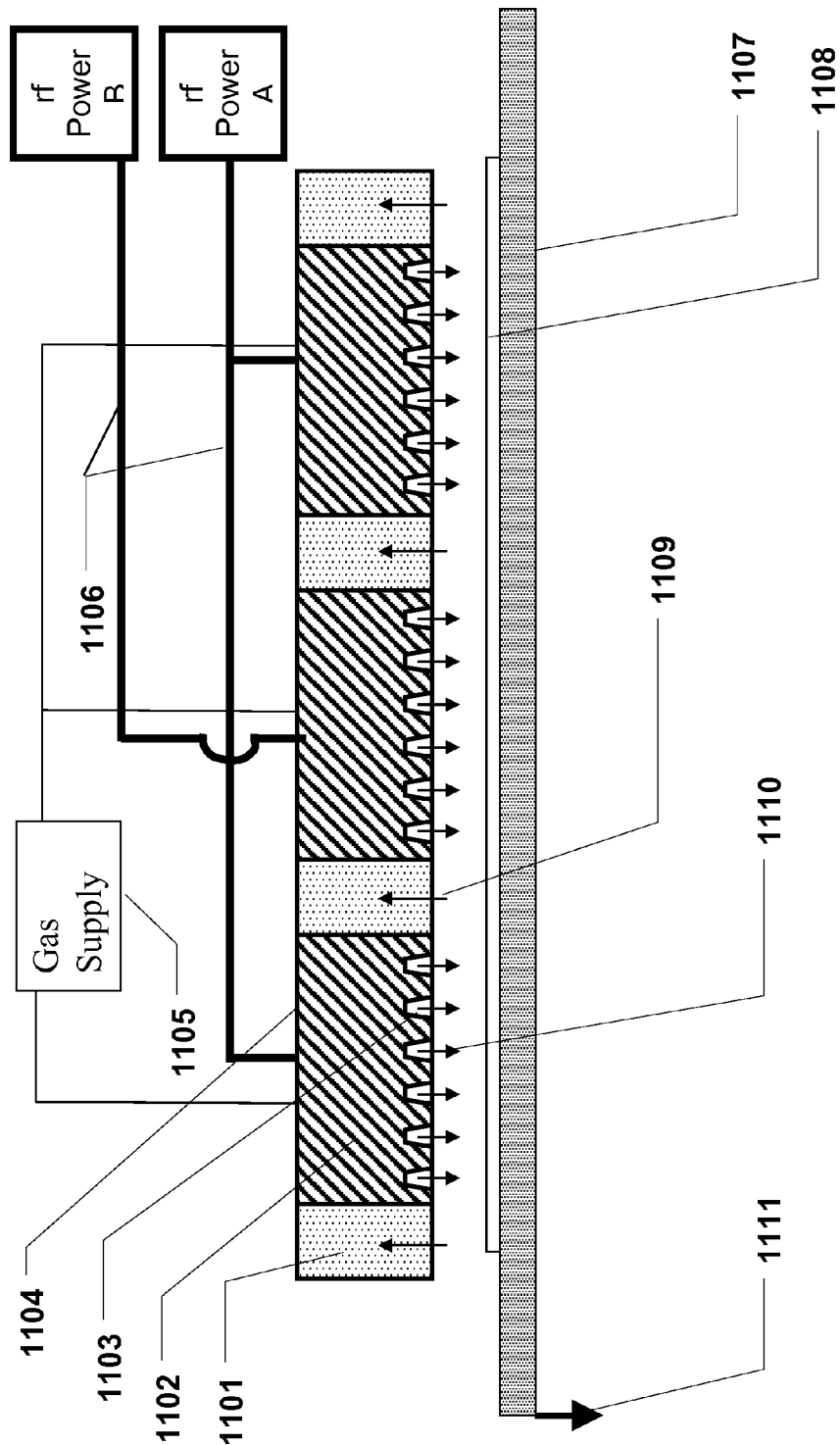
FIG. 11 shows a schematic plasma deposition system for forming a multi-layer coating for encapsulation of a moving substrate having a multiple elongated electrodes which are rf or VHF powered and have showerheads to inject gas into the plasma generated between themselves and the substrate. The electrodes are facing the side of the substrate on which the coating is applied, with a grounded electrode adjacent the opposite side providing support for the substrate.

A schematic of an alternative deposition system is shown in FIG. 11. Shown are elongated insulating exhaust ducts 1101 for process gas 1109, that also separate elongated rf powered electrodes 1102 from one another, and which inject gas into the space between themselves and the substrate 1108 through injector nozzles 1103 which may in some embodiments be hollow cathodes. The electrodes 1102 are alternately fed rf power from either rf power supply A or rf power supply B via the conducting lines 1106, and are each fed process gas from a gas supply 1104. The rf current from each of the powered electrodes 1102 above is then received by the pedestal 1108. If the electrodes 1102 powered by rf power supply A receive 50% more power than those fed by supply B, then if there were at least a dozen such sources the system may deposit the disclosed multi-layer encapsulation structure since sources getting higher power may provide only modestly higher deposition rates but would provide substantially more ion bombardment power resulting in alternating layers with high and low ratio of bombardment to deposition rate.

Figure 12:
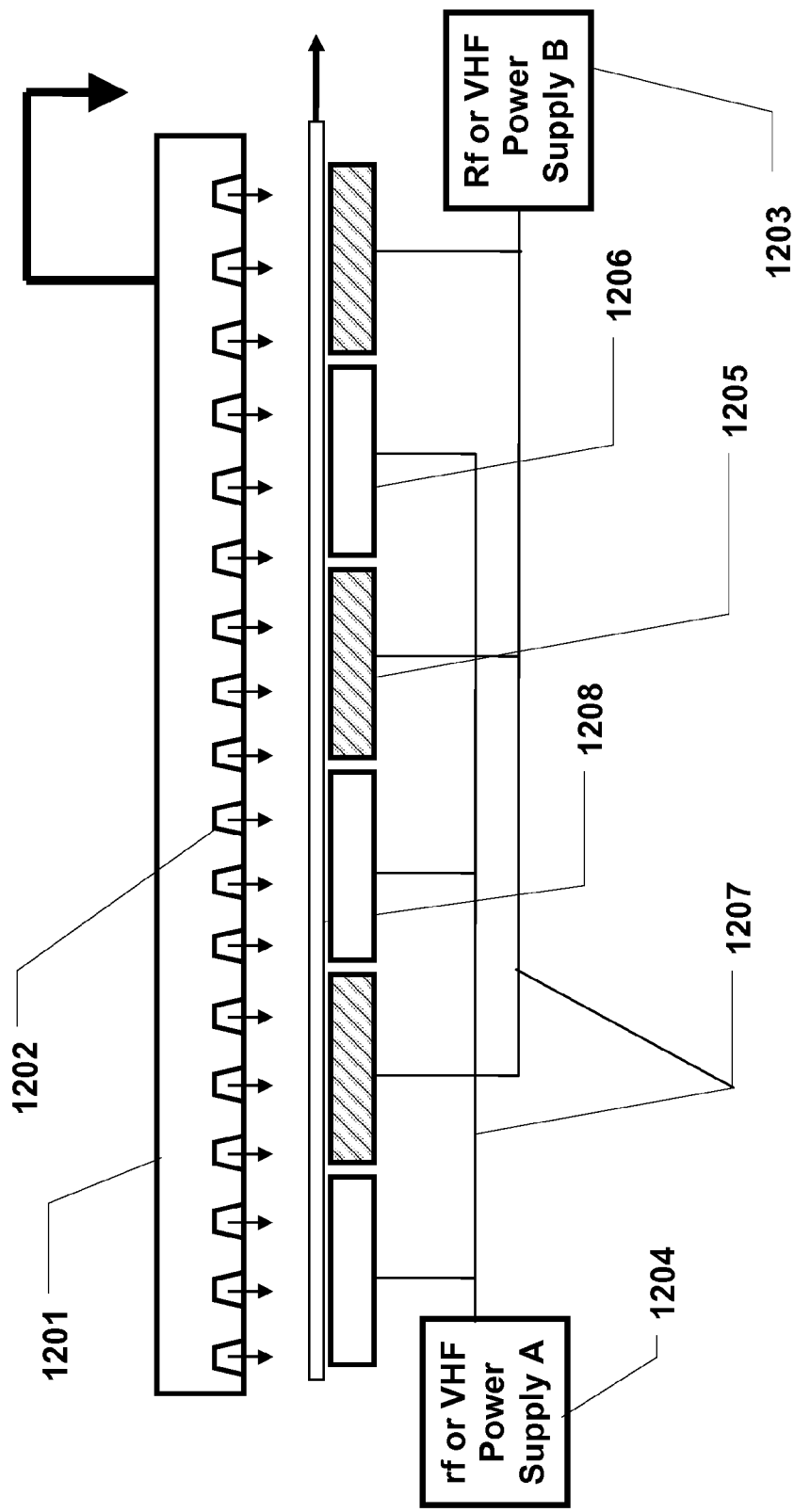
FIG. 12 shows a schematic plasma deposition system having a series of elongated linear electrodes adjacent the side of the substrate that is not to be coated that are alternately powered by different power supplies and a grounded showerhead that supplies process gas above and facing the side of the moving substrate to be coated.

FIG. 12 shows the schematic cross section of a deposition system for a moving substrate having an upper electrode 1201 that is also a showerhead, which may in some embodiments have inject holes 1202 that are enlarged or tapered or simply small diameter channels for gas injection. Below the substrate are a series of parallel elongated electrodes 1205 and 1206 that have a surface adjacent the substrate. RF or VHF power may be applied by conducting lines 1207 to these electrodes in some embodiments from two separate rf or VHF power supplies 1203 and 1204 so that alternate linear pedestal electrodes such as 1206 and 1208 are powered by the same supply and the intervening electrode by a different supply. In some alternative embodiments the two sets of electrodes are powered by the same supply but with different voltage amplitude and either the same or opposite phase—which may be done with a transformer having multiple secondary windings with different numbers of turns. In either case the power to the two sets of electrodes may differ. In this case the plasma conditions above the substrate and the deposition rate may vary modestly—mainly because the gas inject in some embodiments may be the same over the entire area of the showerhead. Further, when the gap between showerhead and substrate is comparable to the width of the linear pedestal electrodes the plasma and deposition rate vary much less with position in the direction of the substrate motion. In this case the deposition rate will typically increase less than linearly with the power on the linear pedestal electrode. This system operates to provide stepwise varying ion bombardment power to any point on the substrate so that the growing film effectively receives a multi-layer coating that has layers with higher and lower ratios of ion bombardment power density to deposition rate.

Figure 13:
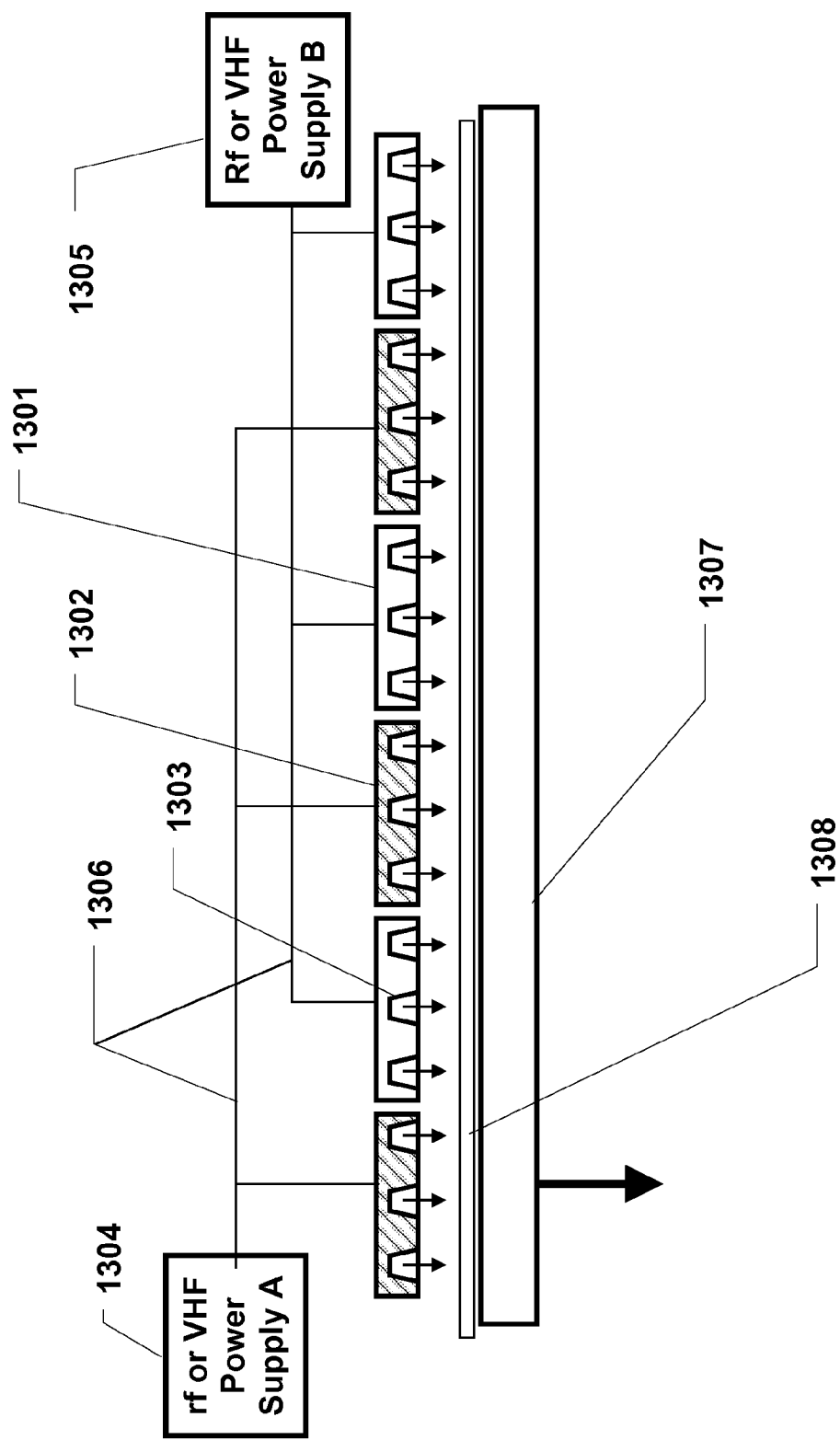
FIG. 13 shows a schematic of a plasma deposition system in which there are multiple elongated linear electrodes facing the side of the moving substrate to be coated. These are powered in two independent groups that alternate and may have common gas supply. These electrodes successively deposit on substrates as they pass through upon a grounded pedestal.

FIG. 13 shows a schematic of a deposition system in which there are multiple elongated linear showerhead electrodes 1301, 1302, and 1303 that include two sets that may be separately powered by two different rf or VHF power supplies—or in some embodiments may be powered by one such power supply with a transformer having multiple secondary windings that provide power of different voltage and/or different phase to the two sets. There also is a gas supply system that is not shown that may provide independently controllable gas supplies for the two sets of electrodes. There is also an electrically grounded pedestal 1307 upon which a substrate 1308 may move either to the left or right in the figure. The gap between the elongated electrodes and the substrate may be smaller or slightly larger than the width of the elongated electrodes. In some embodiments where the gap is somewhat smaller than the width of the electrodes the plasmas under each electrode may be substantially different, whereas if the gap is larger than the width the plasma will have less variation in properties as a point on the substrate moves from under one electrode to the next. The supply of gas and rf/VHF power may be controlled to provide a variation in the ion bombardment energy and current density from the region under one electrode to the region under the next, or to provide a rate of deposition that varies substantially from one region to the next while the ion bombardment power density varies much less from one region to the next. In some embodiments the rate of flow of silane is made different for the two sets of electrodes so that the deposition rate varies from one region to the next, but the rf power to the two sets of electrodes has only small difference so that the ion bombardment power density changes little from one region to the next. In alternative embodiments the relative precursor flow is adjusted to the two sets of electrodes to make the deposition rate approximately constant from region to region while the bias power on the two sets is adjusted to provide a substantial difference in the ion bombardment power density from region to region. In alternative embodiments there may be addition of a gaseous additive such as oxygen in small amounts (between 1% and 5% by flow as a fraction of the silane flow) to the gas feed for one set of electrodes such that if the thin film coating is substantially silicon nitride the oxygen content in the deposited film varies from region to region. If the rf power and other gas flows vary only very slightly from electrode set to set, and the ion bombardment power density varies only slightly, the rate of deposition may vary more significantly so that the rate of deposition produces a film with layers whose hardness, density and stress properties vary from layer to layer producing the desired combination of impermeability and flexibility.

Figure 14:
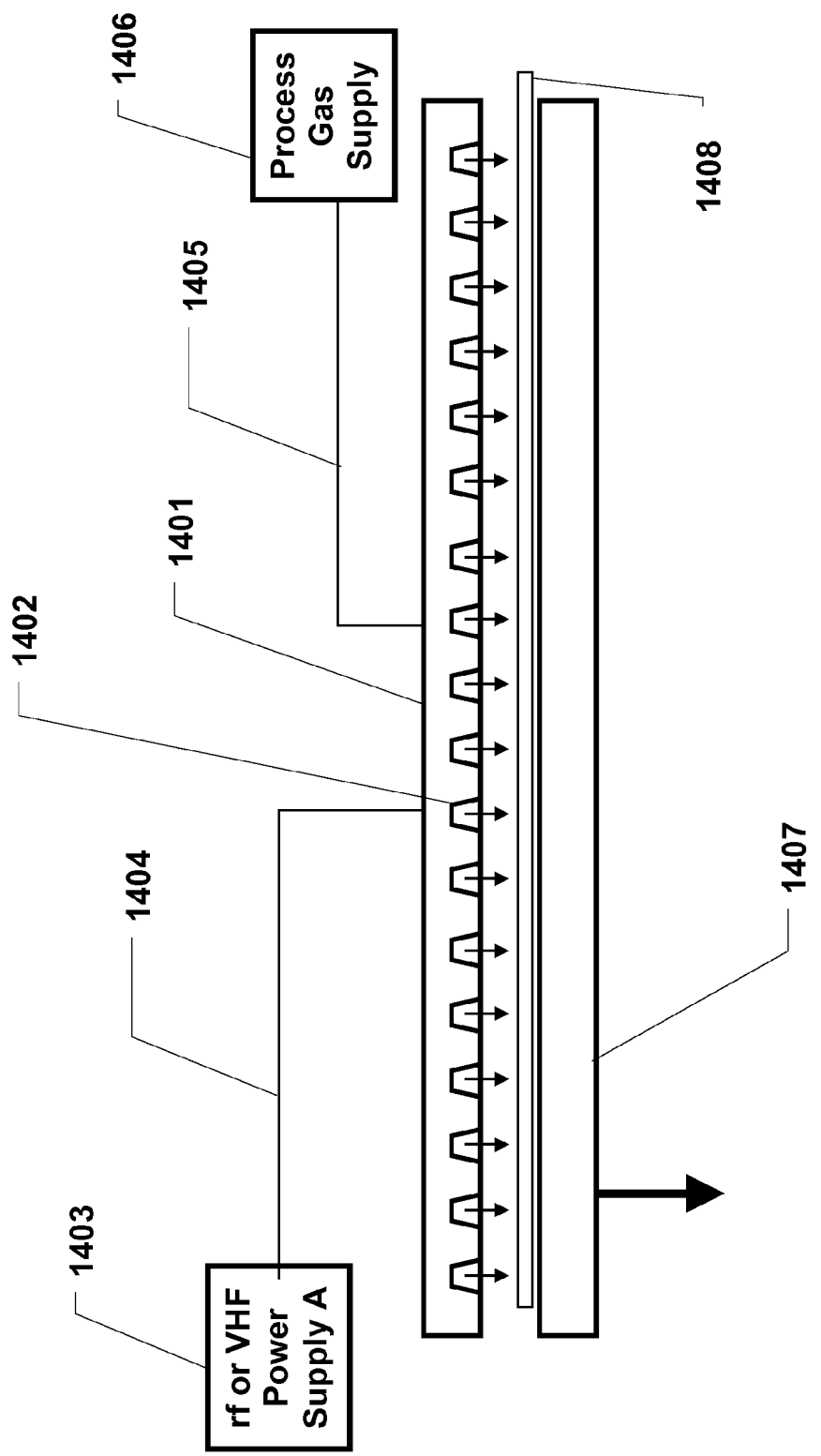
FIG. 14 shows a schematic prior art deposition system (parallel plate PECVD or High Density Plasma CVD) for coating of stationary substrates, that is common in manufacturing of semiconductors and large screens, which may be used to successively deposit the layers of the disclosed multi-layer coating for encapsulation.

FIG. 14 shows a legacy deposition system configuration "parallel plate reactor" wherein there are a powered showerhead 1401 with gas injector holes 1402 that may be hollow cathodes, and a grounded pedestal 1407. To generate the plasma there is an rf or VHF or multiple frequency power supply 1403 connected by power lines 1404 to the showerhead and a process gas supply 1406 connected by gas line or lines 1405 to the showerhead. The substrate 1408 is processed either in a fixed position or as substrate 1408 moves through the space between upper and lower plates by providing process gases including a reactant such as described above that may include nitrogen, oxygen, ammonia, nitrous oxide, and other gaseous compounds having reactive elements such as oxygen and nitrogen. The flexible encapsulation film may be made with this configuration by changing in time steps the reactant and precursor gas flows to this reactor, and in some embodiment changing the rf/VHF power in at least some of the same time steps. By this the system deposits at least two types of thin layers (3 nm to 100 nm thickness) of material, made having largely the same elemental composition, but where the deposition stoichiometry, density, intrinsic stress and one or more minority elemental constituents change from some layers to an adjacent layer. This change in some embodiments is due to a variation from some layers to the next in the ratio of the ion bombardment power density to rate of film deposition and in some embodiment may be due in part to changing slightly the elemental composition of the film. Typically, the ratio of the ion bombardment power density to deposition rate should change from softer, less bombarded layers to the adjacent more bombarded layer by a factor of 1.5 to as much as 10, all within the power and deposition rate ranges shown above, to produce this flexible barrier film.

In some embodiments of deposition systems as schematically shown in FIGS. 10 to 14 the variation in film properties from layer to layer may be only two levels, or may be more, up to 50 different ratios.

Figure 15:
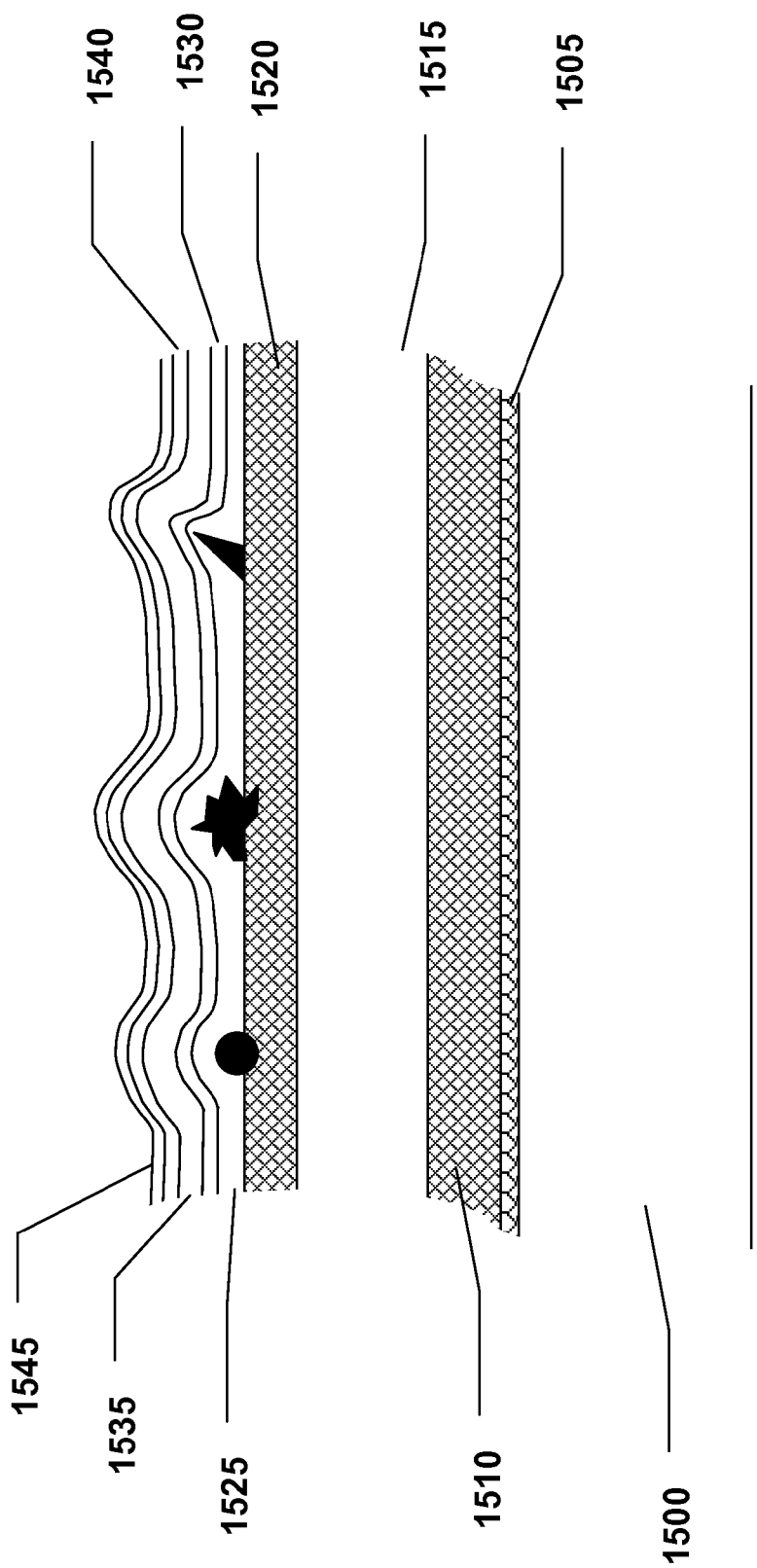
FIG. 15 shows a schematic of a CIGS or Organic photovoltaic device with a 5-layer highly flexible inorganic encapsulation of alternating denser and less dense layers.

FIG. 15 shows a schematic of a CIGS or Organic photovoltaic device with a 5-layer highly flexible inorganic encapsulation of alternating denser and less dense layers. The Photovoltaic device shown is an active device having a lower conductive layer 1505 a pair of layers for light conversion 1510 and 1515, and the top TCO layer 1520. The surface particles are smoothly and tightly surrounded by the first barrier layer 1525 that is between 20 nm and 100 nm thick and made of silicon nitride or silicon oxynitride dielectric that has a high ratio of ion bombardment to deposition rate. The second layer 1530 is a silicon nitride or oxynitride layer between 20 nm and 100 nm thick that has a lower density and is softer. The next hard layer 1535 and softer layer 1540 are within the same ranges of thickness and properties as the initial two layers described above. Finally, there may in some embodiments may be a very thin (<50 nm) top silicon dioxide or silicon oxynitride layer 1545 that is a hard scratch-resistant coating on top of the four barrier layers shown. Their thicknesses should be within the stated ranges, however, so that the total thickness of the encapsulation may be less than about 1000 nm. This four layer encapsulation should meet the requirements of the most sensitive, large area PV panels and achieve less than 10 defects per square meter. Because the layers are more elastic than normal for inorganic material, the disclosed methods allow electronic devices on flexible substrates to tolerate large temperature changes such as required for outdoor use in harsh climates—from −40° C. to 85° C.—or to be flexed with bending radius less than 10 mm without microcracking compromising barrier function.

In a specific embodiment a hermetic encapsulated CIGS device on a substrate, where the substrate is rectangular or a continuous web, includes a lower first conductive layer supported by the substrate, where above the lower conductive layer is a CIGS photovoltaic layer, and above the CIGS photovoltaic layer is a topmost second conductive layer, and where at least one of the conductive layers is transparent. A transparent dielectric material is deposited above the topmost second conductive layer, where the slope of an upper surface of the transparent dielectric material is generally less than 70° relative to a plane of the substrate. A hermetic barrier film is applied on the transparent dielectric material, the hermetic barrier film being transparent to visible light and further including nitrogen, 1% to 5% carbon, and at least one of: silicon, aluminum, zinc, and tin.

Figure 16:
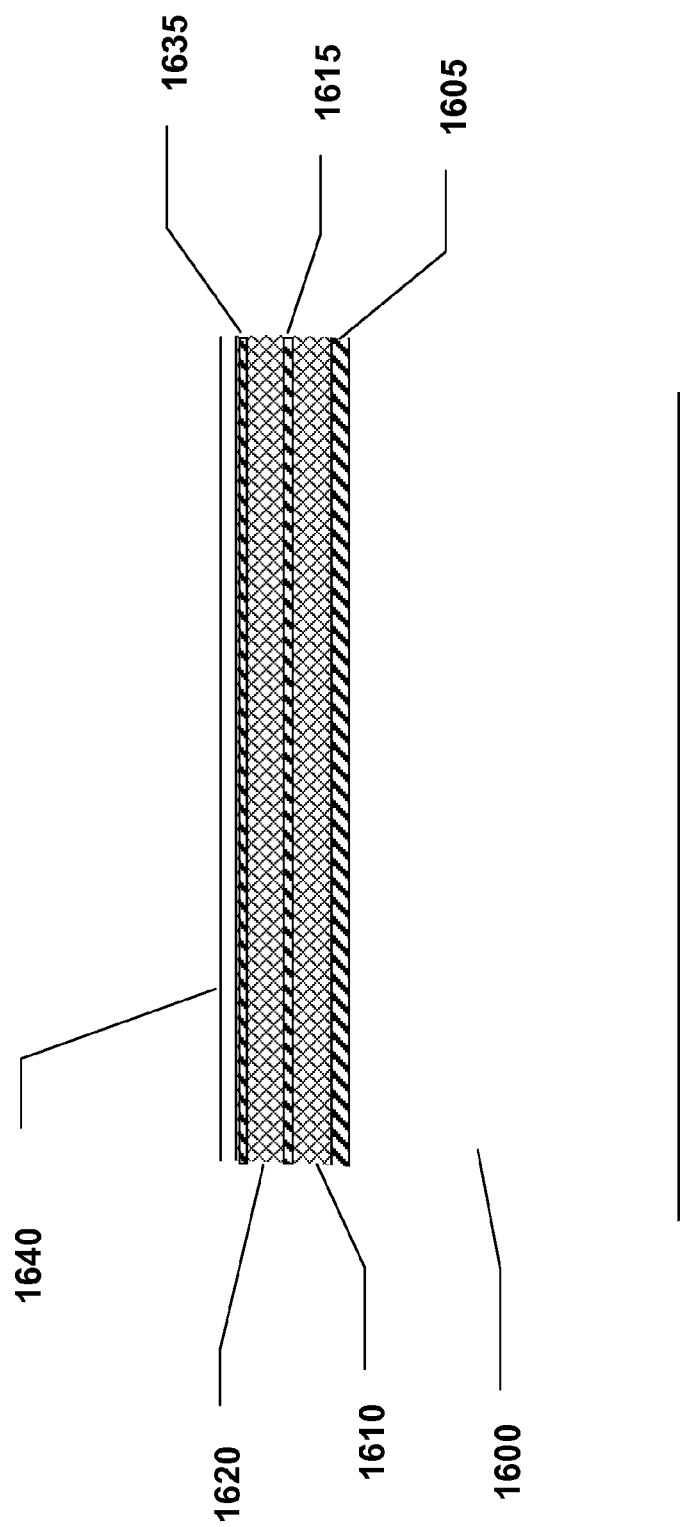
FIG. 16 shows a multi-layer silicon nitride or silicon oxynitride encapsulation coating on a substrate with a hard silicon dioxide layer on top.

The cross section of an encapsulated concentrator lens panel for concentrated PV in some embodiments is shown in FIG. 16. The plastic substrate, 1600, which in some embodiments is made of acrylic or other plastic has a dense and compressive deposited substantially silicon nitride ($Si_3N_4$) layer, 1605, having RI between 1.7 and 2.0 and Young's modulus between 120 GPa and 300 GPa with thickness between 20 nm and 100 nm. The following layer of silicon nitride or oxygen doped silicon nitride, 1610, has RI between about 1.65 and 1.95 and is softer with Young's Modulus between 60 GPa and 120 GPa and thickness between 180 nm and 280 nm. The second layer of denser and less permeable $Si_3N_4$ material 1615 also has RI in the same range as the first layer, along with Young's modulus and thickness in the same ranges as the first layer. The next layer of softer and more permeable material, 1620 has thickness, Young's modulus and intrinsic stress in the same ranges as the first layer 1610. The fifth layer of the encapsulation, 1635 is again the more impermeable, denser material substantially silicon nitride made with higher ratio of ion bombardment power density to deposition rate. This may be up to 20% thinner than the first and third layers but is within the same thickness range as previous layers. This layer also has both intrinsic stress and Young's modulus the same as the first and third layers 1615 and 1625. Finally, there may be a silicon dioxide or silicon oxynitride layer deposited on the top to provide a more stable scratch resistant surface. This layer may be as thin as 20 nm and no more than 100 nm.

Figure 17:
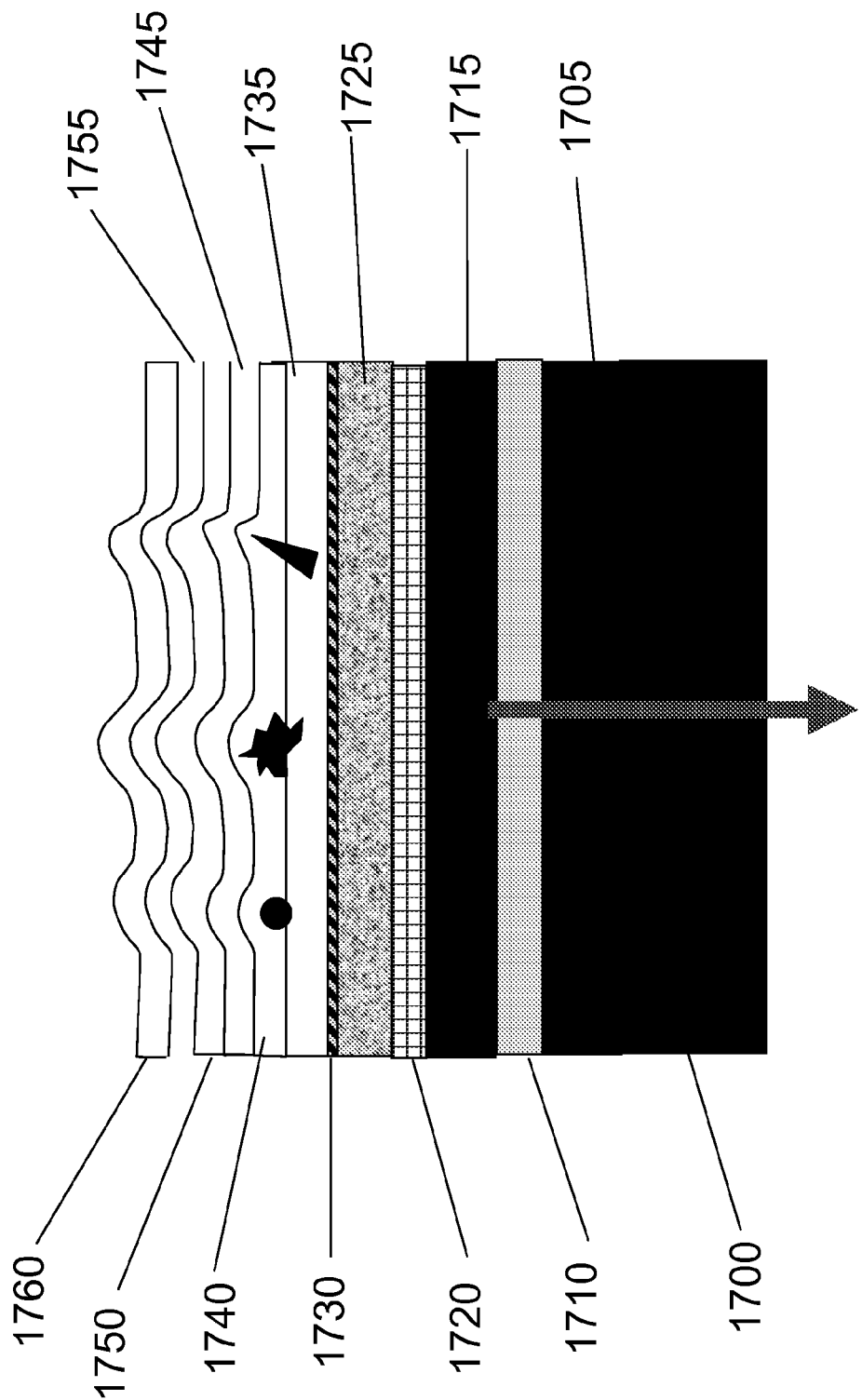
FIG. 17 shows an OLED display or lighting device protected by the disclosed multi-layer encapsulation coating whose first layer covers particles on the surface of the device.

The structure of the finished encapsulated OLED device as shown in FIG. 17 in some embodiments may include the four-layer (two dyad) encapsulation having two barrier layers. Supporting a flexible OLED device is a substrate that may also include a hermetic barrier 1700. This substrate supports an electrically conductive layer 1705 and upon layer 1705 a hole transport layer 1710. This layer in turn supports a phosphor layer 1715 that converts light from the OLED layer 1720 into photons having the desired wavelength or distribution of wavelengths. The OLED layer 1720 in turn supports the electron transport layer 1725 and the OLED layer 1720 supports the very thin low work-function cathode layer 1730 that provides electrons that will produce the light when conducting through the OLED layer 1720. Upon the cathode is a layer of transparent conductive oxide 1735, which may be aluminum doped zinc oxide, which in turn supports the first layer of 1740 of the barrier coating. This first layer of 1740 is substantially of silicon nitride or silicon oxynitride and is a type 1 material deposited with higher ratio of ion bombardment power to deposition rate. It has thickness between 5 nm and 50 nm thick and has Young's Modulus between 120 GPa and 300 GPa. Upon this is the second layer 1745 of softer material type 2 with much the same composition as the first layer which is between 10 nm and 100 nm thick and formed substantially of silicon nitride or silicon oxynitride with intrinsic stress less than 50 MPa. This layer in turn supports a second barrier layer 1750 of type 1 material that has approximately the same properties as the first barrier layer, as well as thickness in the same range. Upon this is the second softer layer 1755 that is approximately the same composition and thickness as the first softer type 2 layer. It should be noted that the type 2 layers between the barrier layers is itself a moderately effective barrier material that would have a barrier performance between $10^{-1}$ to $10^{-3}$ g/m$^2$/day. Finally, upon the second type 2 layer is a third type 1 layer 1760 with properties as in the first and second type 1 layers in this layered barrier structure. Since the softer layers help avoid vertical alignment of the defects that may occur in the first and second barrier layers, the distance between defects in the plane of the substrate is likely to be several millimeters or more for such barriers. This results in a delay of years in the moisture transmission from a defect in the top barrier layer to a defect in the lower barrier layer due to the slow transmission in the smoothing structure material. Key is the combination of the two effects of the smoothing structure: (1) virtually eliminating vertically aligned defects in the two barrier layers, and (2) making a very long delay in moisture and oxygen transmission between defects in the upper and lower barrier layers due to the aspect ratio of the leak path and the slow transmission in the smoothing structure between.

In some embodiments the material of this barrier structure may have carbon content from 1% to 3% in the softer layers. Those barrier layers since subjected to ion bombardment also help smooth the surface because they have been subjected to more ion bombardment, and have greater compressive intrinsic stress. Those bands that may be type 2 barrier layers may have received less ion bombardment relative to the deposition rate (which means a given amount of deposited material has received less ion bombardment during deposition) and have greater carbon content. Such bands alternating through the thickness of the film.

Figure 18:
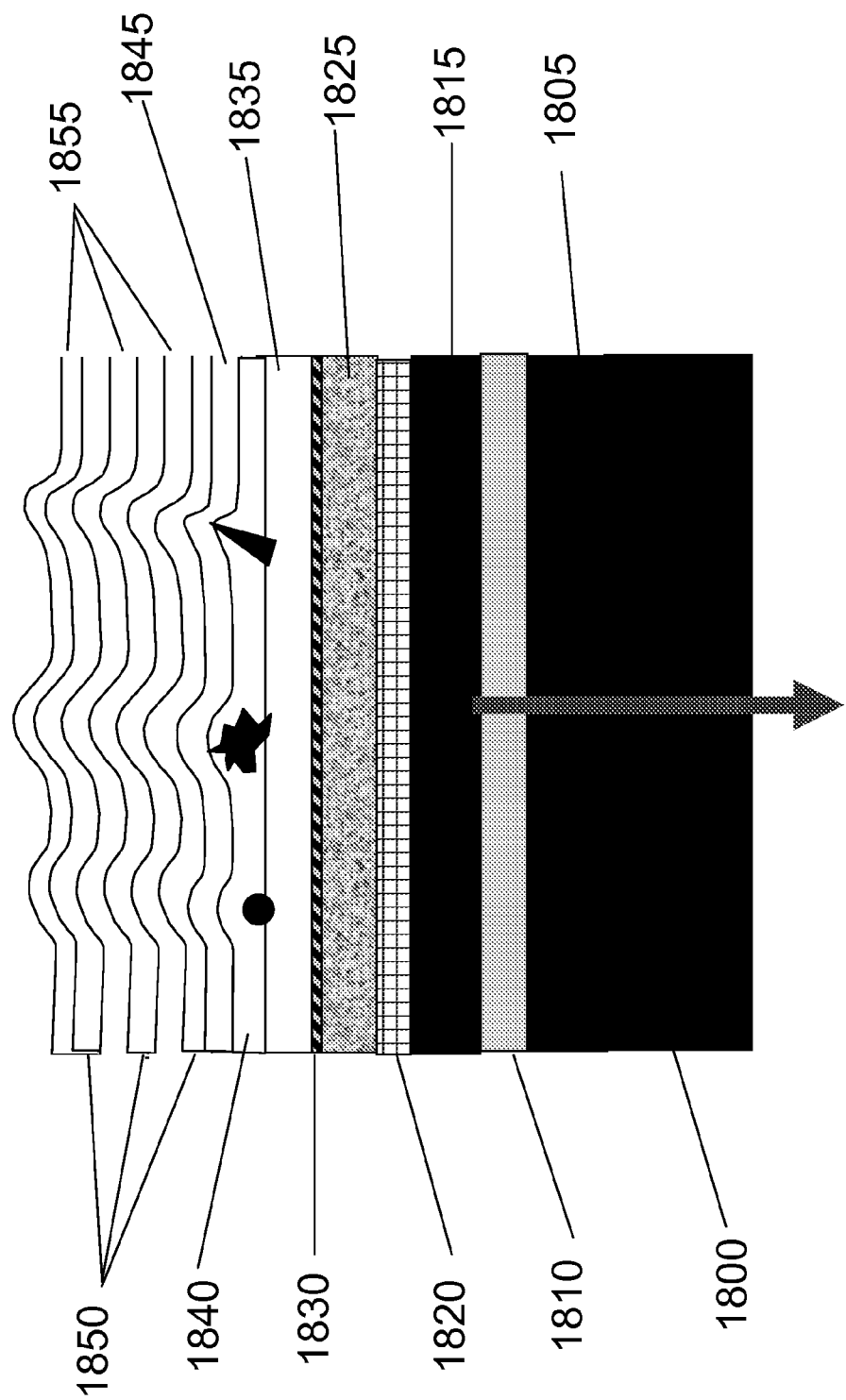
FIG. 18 shows an OLED device having an eight-layer barrier coating with alternating denser and less dense layers that is substantially of silicon nitride or silicon oxynitride.

Encapsulation for flexible OLED displays or lighting may have four pairs of layers, each including of a type 1 layer and a type 2 layer, as shown in FIG. 18. Supporting a flexible OLED device is a substrate that may also include a hermetic barrier 1800. This substrate supports an electrically conductive layer 1805 and upon layer 1805 a hole transport layer 1810. This layer in turn supports a phosphor layer 1815 that converts light from the OLED layer 1820 into photons having the desired wavelength or distribution of wavelengths. The OLED layer 1820 in turn supports the electron transport layer 1825 which in turn supports the very thin low work-function cathode layer 1830 that provides electrons that will produce the light when conducting through the OLED layer 1820. Upon the cathode is a layer of transparent conductive oxide 1835, which may be aluminum doped zinc oxide, which in turn supports the first layer of 1840 of the barrier coating. This layer is substantially of silicon nitride or silicon oxynitride and is a type 1 material deposited with higher ratio of ion bombardment power to deposition rate. It has thickness between 5 nm and 50 nm thick and has Young's Modulus between 120 GPa and 300 GPa. Upon this is the second layer 1845 of softer material type 2 with much the same composition as the first layer which is between 10 nm and 100 nm thick and formed substantially of silicon nitride or silicon oxynitride with intrinsic stress less than 50 MPa. This layer supports six more layers including second, third and fourth barrier layers 1850 of type 1 material that have approximately the same properties as the first barrier layer, as well as thickness in the same range. Upon each of these type 1 layers are second, third and fourth softer layers 1855 that are approximately the same composition and thickness as the first softer type 2 layer. It should be noted that the type 2 layers between the barrier layers are themselves moderately effective barrier material that have barrier performance between $10^4$ to $10^{-3}$ $g/m^2/day$. Since the softer layers help avoid vertical alignment of the defects that may occur in the first and second barrier layers, the distance between defects in the plane of the substrate is likely to be several millimeters or more for such barriers. This results in a delay of years in the moisture transmission from a defect in the top barrier layer to a defect in the lower barrier layer due to the slow transmission in the smoothing structure material. Key is the combination of the two effects of the softer layers: (1) virtually eliminating vertically aligned defects in the two barrier layers, and (2) making a very long delay in moisture and oxygen transmission between defects in the barrier layers above and below due to the aspect ratio of the leak path and the slow transmission in the smoothing structure between.

In some embodiments the disclosed encapsulation deposition may be done on a polymer substrate having no device already on it, but serving as substrate to protect materials that will be deposited later above the barrier film. In some embodiments the barrier deposition method is used to cover materials or devices that have been built underneath such as organic LED or PV materials or electrically conducting metal oxides or metals already deposited on the substrate.

In a specific embodiment a hermetic encapsulated OLED device on a substrate, where the substrate is rectangular or a continuous web, includes a multi-layer structure supported on the substrate, the multi-layer structure having a lower conductive layer, a hole transport layer, an Organic Light Emitting Diode layer, an electron transport layer, and an upper transparent conductive layer. The embodiment of the hermetic encapsulated OLED device further includes at least one smoothing structure above the multi-layer structure, where the at least one smoothing structure is a dense, transparent dielectric material having at least two sub-layers of less than 30 nm thickness, each of the at least two sub-layers with compressive intrinsic film stress greater than 500 MPa, and wherein an upper surface of the at least one smoothing structure is smooth with a slope generally less than 70° relative to a large scale plane of the substrate, and upon each of the at least one smoothing structures is a hermetic barrier layer that is largely transparent to visible light, where the hermetic barrier layer comprises silicon, nitrogen and between 1% to 3% carbon.

In some embodiments the method may be used on a substrate that supports an electronic device whose surface has already been planarized by a polymer based layer to cover the topography of the underlying materials. This device may be an OLED-based display or photovoltaic panel or OLED lighting panel. The process in some embodiments may include one or more of the pre-treatments including: [cryogenic aerosol cleaning, UV cleaning, a surface conditioning process incorporating silicon atoms into the near-surface region of the polymer underlayer, and plasma surface treatment] in addition to deposition of at least one smoothing structure and barrier layer. Appropriate encapsulation architectures as described above may then be used for different types of products and substrates.

The invention is not intended to be limited to the specific combinations of process steps or configurations of components that are described above but rather may include combinations not specifically described or illustrated that may embody the principles which have been taught.

The disclosed deposition process, in some embodiments, may at any instant of time have substantial variation both in the ion bombardment power density and in the rate of deposition of material at different positions on the substrate surface. For a substrate moving with respect to the plasma source(s) this may mean that for any given point on the substrate, either or both the film deposition rate and the ion bombardment may vary as a function of time. In the case of linear plasma sources, whether single or grouped in arrays, there may be a substantial variation in deposition rate with position on a stationary substrate, so that when the substrate is moved relative to the source the film deposited may include some material layers with more intense ion bombardment to densely bind the deposited material to the surface particles. In some embodiments the process may include sputter etch of the surface to smooth previously deposited material and protruding particles. This very tightly and seamlessly encases surface irregularities and tightly fills any gap between particle and surrounding new material. It covers some areas on top of the particles and fills in the volume around their base and may leave exposed parts at the top of the deposited film, resulting in a smooth surface. The deposition of layers within this structure may be done at substrate temperatures less than 150° C. and in particular inventive embodiments occurs at substrate temperatures less than 100° C. In some embodiments for sensitive substrates such as those carrying OLED devices, or some plastics, the deposition may be done at substrate temperatures less than 85° C. Deposition of oxide, oxynitride or nitride materials at substantial rates of deposition at such low substrate temperatures may be enabled by using linear plasma sources having injection of reactant gases between pairs of electrodes as in the incorporated references.

The disclosed method succeeds where the prior art fails in part for the reasons: (1) because the method more strongly bonds the deposited layers to particles and surface defects, and (2) leaves the exposed surface smoother, providing a better and less rough surface as a base for the barrier layer. This method and film thereby avoids micro-cracking between particles and barrier film when the substrate is flexed, or expands due to temperature increase. Such micro-cracking usually propagates to layers above or below, such as barrier layers, and frequently results in leaks.

In some embodiments varying levels of ion bombardment may be concurrent with deposition and provided by the same plasma sources wherein deposition is taking place. This may serve to more densely fill the deposited material around the particle or surface defect and remove protruding features from particles, as well as affect the bulk film properties.

The Multi-Layer Barrier Structure.

In some embodiments this material or structure may be substantially transparent to visible light and must be highly impervious to gases so that diffusion rates of water vapor or oxygen through the material are very low, typically between about $10^{-3}$ grams/m²/day to about $10^{-8}$ grams/m²/day. In some example embodiments the barrier may be deposited at substrate temperatures up to 150° C., and in some example embodiments at substrate temperatures less than 100° C. In some embodiments where there is highly temperature sensitive material such as OLED, the barrier may be deposited with substrate temperature less than 80° C. In some embodiments the barrier may include multiple thin layers in which the film composition does not vary substantially but other film properties vary in an alternating or periodic way. In some embodiments layers of denser material having more compressive intrinsic stress alternate with layers of less dense material having less compressive or tensile intrinsic stress. In some embodiments small amounts of oxygen are added to the gas injected to make softer layers that have silicon oxynitride and such layers will be more elastic than the layers of silicon nitride that are the less permeable barrier layers. In some embodiments there may be an admixture of CHx species in the softer and more flexible layers that will increase the permeability. This may be accomplished by adding a small amount of a carbon containing gas to the feed gas of a source depositing the layer. In some embodiments layers alternate between those exposed during deposition to a greater amount of ion bombardment relative to rate of growth of the film on the surface, and those not subjected to as much ion bombardment relative to the rate of growth of material on the surface. Such materials may be deposited in an alternating manner or with continuous variation in either bombardment or deposition rate, or both. The ratio of ion bombardment power density to the rate of growth of the film is well known to determine the density, composition and micro-structure of plasma deposited films. Thus, by varying the ratio of ion bombardment power to deposition rates during deposition of the film there will be a grading or layering of the properties. If there are periods where the bombardment and growth rates are steady or slowly varying, separated by rapid changes in time of either deposition rate or ion bombardment at on the substrate, the film deposited will show layering with broader bands having constant properties and between them narrow bands where the properties of the film transition. If the bombardment and deposition transition slowly throughout the deposition then composition and properties of the material will vary through the thickness of the film.

The foregoing description is illustrative of particular embodiments of the invention, but is not meant to be a limitation upon the practice thereof. The following claims, including all equivalents thereof, are intended to define the scope of the invention.

The invention claimed is:

1. A method for forming a hermetic moisture and oxygen barrier coating on a substrate, the hermetic moisture and oxygen barrier coating comprising a first layer, a second layer and a third layer, and the substrate supporting an opto-electronic device, the method comprising:
    maintaining the substrate in a temperature range below about 100° C. in a processing chamber;
    coating the substrate with a first layer of transparent material by plasma enhanced chemical vapor deposition including ion bombardment of the first layer from a plasma adjacent to the substrate, wherein the first layer has a thickness less than 200 nm and has a hardness greater than 8 GigaPascals;
    coating the substrate with a second layer of the transparent material to form a transparent dielectric layer by plasma enhanced chemical vapor deposition including ion bombardment of the second layer from the plasma adjacent to the substrate, wherein a ratio of ion bombardment power from the adjacent plasma relative to a film growth rate for the second layer is less than a ratio of ion bombardment power from the adjacent plasma relative to a film growth rate for the first layer, and wherein the second layer has a thickness less than 200 nm; and
    coating the substrate with a third layer of the transparent material by plasma enhanced chemical vapor deposition including ion bombardment of the third layer from the plasma adjacent to the substrate, wherein a ratio of ion bombardment power from the adjacent plasma relative to a film growth rate for the third layer is substantially similar to the ratio of ion bombardment power from the adjacent plasma relative to the film growth rate for the first layer, wherein the third layer has a thickness less than 200 nm,
    wherein the first, second and third layers each comprise silicon and nitrogen, and wherein the third layer has the same chemical composition as the first layer.

2. The method of claim 1, wherein the substrate is rectangular or a continuous web.

3. The method of claim 2, wherein the transparent material comprises silicon oxynitride having a content of oxygen less than 10%.

4. The method of claim 2, wherein the transparent material is substantially silicon nitride.

5. The method of claim 1, wherein a plurality of additional layers with a thickness less than 200 nm are deposited on the substrate at the temperature of less than 100° C., and wherein a ratio of ion bombardment power to film growth rate varies between successive ones of the plurality of additional layers.

6. The method of claim 1, further comprising moving the substrate in a process chamber, wherein during the moving of the substrate, a portion of the first layer is deposited on a first region of the substrate, and at the same time, a portion of the second layer is deposited on a second region of the substrate.

7. The method of claim 1, wherein the first layer is a type 1 layer that is harder, denser, and less permeable than the second layer which is a type 2 layer.

8. The method of claim 1, wherein a cryogenic spray clean is performed on a top surface of the opto-electronic device before the hermetic moisture and oxygen barrier coating is formed.

9. The method of claim 1, wherein the opto-electronic device comprises at least one of an Organic Light Emitting Diode (OLED) or a photovoltaic device.

10. A hermetically encapsulated Organic Light Emitting Diode (OLED) device, comprising:
    a multi-layer structure supported on a substrate, the multi-layer structure comprising a conductive layer, a hole transport layer, an OLED layer, an electron transport layer, and a transparent conductive layer configured as a cathode; and
    at least three consecutive layers forming a coating above the multi-layer structure, wherein the at least three consecutive layers comprise a first layer, a second layer and a third layer, and wherein the at least three consecutive layers are formed by a plasma deposited, transparent material comprising at least one of: silicon nitride and silicon oxynitride, wherein the first layer is harder than the second layer,
wherein the first layer is characterized as a type 1 layer and has an elastic modulus between about 80 and 240 GigaPascals,
wherein the second layer is characterized as a type 2 layer and has an elastic modulus between about 40 and 130 GigaPascals,
wherein the third layer is disposed adjacent to the second layer and has substantially the same properties as the first layer, and
wherein the first and the third layers are each less than 50 nm in thickness so as to maintain flexibility of the multi-layer structure.

11. The device of claim 10, wherein the substrate is rectangular or a continuous web.

12. The device of claim 10, wherein at least one pair of type 1 and type 2 layers are disposed on the second layer, providing a water vapor transmission rate that is less than about $10^{-3}$ grams/m$^2$/day.

13. The device of claim 12, wherein a density of defects that allows moisture transmission through the at least three layer coating is less than 10 defects/m$^2$.

14. The device of claim 12, wherein the type 1 layers are substantially silicon oxynitride and the type 2 layers are also silicon oxynitride, and wherein an oxygen content of the type 2 layers is less than an oxygen content of the type 1 layers.

15. The device of claim 12, wherein the OLED device is flexible and built on a flexible substrate.

16. The hermetically encapsulated OLED device of claim 10, wherein the second layer is less than 200 nm in thickness.

17. A hermetically encapsulated Copper Indium Gallium di-Selenide (CIGS) device, comprising:
a multi-layer structure supported on the substrate, the multi-layer structure comprising a conductive layer, a photovoltaic layer, and a transparent conductive layer configured as a cathode; and
at least three consecutive layers forming a coating above the multi-layer structure, wherein the at least three consecutive layers comprise a first layer, a second layer and a third layer, wherein the at least three consecutive layers are formed by a plasma deposited, inorganic, and transparent material,
wherein the first layer is harder than the second layer,
wherein the first layer is characterized as a type 1 layer and has a hardness between about 8 and 16 GigaPascals and,
wherein the second layer is characterized as a type 2 layer, and has a hardness between about 5 and 10 GigaPascals,
wherein the third layer is disposed adjacent to the second layer and has substantially the same properties as the first layer, and
wherein the first and the third layers are resistant to moisture permeation.

18. The device of claim 17, wherein the substrate is rectangular or a continuous web.

19. The device of claim 17, wherein at least one pair of type 1 and type 2 layers are disposed on the second layer, providing a water vapor transmission rate that is less than about $10^{-3}$ grams/m$^2$/day.

20. The device of claim 19, wherein a density of defects that allows moisture transmission through the at least three layer coating is less than 10 defects/m$^2$.

21. The device of claim 19, wherein the type 1 layers are substantially silicon oxynitride and the type 2 layers are also silicon oxynitride, and wherein an oxygen content of the type 2 layers is less than an oxygen content of the type 1 layers.

22. The device of claim 19, wherein the CIGS device is flexible and built on a flexible substrate.

23. The hermetically encapsulated CIGS device of claim 17, wherein the second layer is less than 200 nm in thickness.

24. A hermetically encapsulated Organic Light Emitting Diode (OLED) device, comprising:
a multi-layer structure supported on the substrate, the multi-layer structure comprising a conductive layer, a hole transport layer, an OLED layer, an electron transport layer, and a transparent conductive layer configured as a cathode;
at least one smoothing structure disposed above the multi-layer structure, wherein an upper surface of the at least one smoothing structure is smooth with a slope generally less than 70° relative to a large scale plane of the substrate; and
at least two pairs of type 1 and type 2 layers disposed on each of the at least one smoothing structures, the type 1 and type 2 layers differing substantially in their respective hardness but having substantially the same chemical composition,
wherein each of the type 1 layers has a hardness between about 8 and 16 GigaPascals, and has a thickness less than or about 50 nm so as to maintain flexibility of the multi-layer structure, and
wherein each of the type 2 layers has a hardness between about 5 and 10 GigaPascals.

25. The device of claim 24, wherein the substrate is rectangular or a continuous web.

26. The device of claim 24, wherein at least one additional pair of layers as said type 1 and type 2 layers are disposed on the two pairs of type 1 and type 2 layers, providing a water vapor transmission rate less than about $10^{-3}$ grams/m$^2$/day.

27. The device of claim 26, wherein a density of defects is less than 10 defects/m$^2$.

28. The device of claim 26, wherein the type 1 layers are substantially silicon oxynitride and the type 2 layers are also silicon oxynitride, wherein an oxygen content of the type 2 layers is less than an oxygen content of the type 1 layers.

29. The device of claim 26, wherein the OLED device is flexible and built on a flexible substrate.

* * * * *